United States Patent
Koga

(10) Patent No.: US 10,170,357 B2
(45) Date of Patent: Jan. 1, 2019

(54) SOI WAFER MANUFACTURING PROCESS AND SOI WAFER

(71) Applicant: SUMCO CORPORATION, Tokyo (JP)

(72) Inventor: Yoshihiro Koga, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 302 days.

(21) Appl. No.: 15/241,457

(22) Filed: Aug. 19, 2016

(65) Prior Publication Data

US 2017/0062268 A1    Mar. 2, 2017

(30) Foreign Application Priority Data

Aug. 27, 2015 (JP) ................. 2015-167949

(51) Int. Cl.
*H01L 21/762* (2006.01)
*H01L 21/02* (2006.01)
(Continued)

(52) U.S. Cl.
CPC .. *H01L 21/76254* (2013.01); *H01L 21/02024* (2013.01); *H01L 21/02263* (2013.01); *H01L 21/263* (2013.01); *H01L 29/0649* (2013.01)

(58) Field of Classification Search
CPC combination set(s) only.
See application file for complete search history.

(56) References Cited

U.S. PATENT DOCUMENTS 8,093,135 B2  1/2012 Shimomura et al.
8,470,648 B2  6/2013 Yamazaki et al.
(Continued)

FOREIGN PATENT DOCUMENTS

EP    2924715 A1    9/2015
JP    H05-55230 A   3/1993
(Continued)

OTHER PUBLICATIONS

Office Action issued in French family member Patent Appl. No. 1657893, dated Mar. 22, 2018, along with an English translation thereof.
(Continued)

*Primary Examiner* — Ratisha Mehta
(74) *Attorney, Agent, or Firm* — Greenblum & Bernstein, P.L.C.

(57) ABSTRACT

Provided is an SOI wafer manufacturing method that allows production of an SOI wafer having a high gettering ability and a small resistance variance in a thickness direction of an active layer, at high productivity. The SOI wafer manufacturing method includes a first step of implanting light element ions to a surface of at least one of a first substrate and a second substrate to form, on the at least one of the first substrate and the second substrate, a modified layer in which the light element ions are present in solid solution, a second step of forming an oxide film on a surface of at least one of the first substrate and the second substrate, a third step of bonding the first substrate and the second substrate according to a normal-temperature vacuum bonding method, and a fourth step of obtaining an active layer by thinning the first substrate.

15 Claims, 19 Drawing Sheets

(51) Int. Cl.
*H01L 21/263* (2006.01)
*H01L 29/06* (2006.01)

(56) References Cited

U.S. PATENT DOCUMENTS

| | | |
|---|---|---|
| 2008/0251126 A1 | 10/2008 | Yamazaki et al. |
| 2009/0258475 A1* | 10/2009 | Endo ................. H01L 21/30625 438/459 |
| 2009/0325363 A1 | 12/2009 | Ohnuma et al. |
| 2014/0080247 A1* | 3/2014 | Kadono ............ H01L 21/02381 438/73 |
| 2015/0303097 A1 | 10/2015 | Konishi et al. |

FOREIGN PATENT DOCUMENTS

| | | |
|---|---|---|
| JP | 8-78644 | 3/1996 |
| JP | 2001-244262 A | 9/2001 |
| JP | 2009-027156 A | 2/2009 |
| JP | 2009-076879 A | 4/2009 |
| JP | 2013-128047 A | 6/2013 |
| JP | 2015-050424 A | 3/2015 |
| JP | 2015-128149 A | 7/2015 |
| WO | 2014080874 A1 | 5/2014 |

OTHER PUBLICATIONS

U.S. Appl. No. 15/241,431 to Yoshihiro Koga, filed Aug. 19, 2016.
Office Action issued in Japanese family member Patent Appl. No. 2015-167949, dated Oct. 2, 2018, along with an English translation thereof.

\* cited by examiner

SOI WAFER MANUFACTURING PROCESS AND SOI WAFER

TECHNICAL FIELD

The present disclosure relates to an SOI wafer manufacturing process and to an SOI wafer.

BACKGROUND

An silicon on insulator (SOI) wafer structurally includes a support substrate, above which an insulating film of, for example, oxide silicon ($SiO_2$), and a single crystal silicon layer used as a device active layer are formed in this order. A bonding method is one of typical methods of manufacturing an SOI wafer. The bonding method is a method of manufacturing an SOI wafer by forming an oxide film (a buried oxide [BOX] layer) on at least one of the support substrate and the substrate to be used as the active layer, and subsequently by superposing these substrates on each other via the oxide film and subjecting the superposed substrates to bonding thermal processing at a high temperature of approximately 1200° C.

Technologies have been proposed for imparting metal impurity gettering ability to thus obtained SOI wafer. Patent Literature 1 describes a bonded SOI wafer manufacturing process, including implanting ions to a substrate to be used as the active layer to form a strain region (a gettering site), subsequently forming the oxide film on the substrate to be used as the active layer or on the support substrate according to a thermal oxidization method, and subsequently superposing both the substrates and subjecting the superposed substrates to bonding thermal processing.

CITATION LIST

Patent Literature

PTL 1: JPH0878644A

SUMMARY

However, earnest studies conducted by the present inventor have revealed that a bonded SOI wafer obtained according to the manufacturing process of Patent Literature 1 does not have a sufficient gettering ability. Furthermore, it has been revealed that, in a bonded SOI wafer obtained according to the manufacturing process of Patent Literature 1, resistance varies significantly in the vicinity of an interface of the active layer with respect to the oxide film, and this causes a non-uniform resistivity distribution of the active layer in the thickness direction thereof. The non-uniform resistivity distribution leads to occurrence of a leak current between p-type and n-type materials in a p-n junction formed in a device process, possibly resulting in deterioration in device characteristics.

Furthermore, in formation of the oxide film according to the thermal oxidization method, a long period of time is required for increasing the thickness of the oxide film. Although one way considered to prevent a leak current from flowing between devices via the oxide film is to increase the thickness of the oxide film, it takes 1 month or more to form an oxide film in a thickness of from 5 to 10 μm according to the thermal oxidation method. Besides, the bonding thermal processing requires a long period of time. Accordingly, the manufacturing process according to Patent Literature 1 also faces the problem of low productivity.

In light of the above problems, the present disclosure is to provide an SOI wafer manufacturing process that allows production of an SOI wafer having a high gettering ability and a small resistance variance in the thickness direction of the active layer, at high productivity.

The present inventor has conducted earnest studies to solve the above problems and found the following. Hereinafter, one of two silicon wafers bonded together that includes a portion finally constituting the active layer of the SOI wafer is called the "substrate to be used as the active layer" or the "first substrate", and the other one of the two silicon wafers that constitutes a supporting portion of the SOI wafer is called the "support substrate" or the "second substrate".

(A) When an oxide film is formed on the substrate to be used as the active layer according to the thermal oxidization method, approximately 45% of the oxide film formed consists of Si according to a relation between $SiO_2$ and Si in terms of density and the number of molecules, and therefore, a superficial portion of the substrate to be used as the active layer is consumed by a thickness corresponding to approximately 45% of the thickness of the oxide film formed. Accordingly, when the oxide film is formed on the substrate, to be used as the active layer, that includes an ion implantation layer (gettering layer) in the superficial portion according to the thermal oxidization method, the ion implantation layer in the superficial portion is disappeared. This may mean infeasibility of the gettering ability.

This issue also applies when the ion implantation layer is formed on the support substrate and subsequently, an oxide film is similarly formed on the support substrate. Furthermore, when an oxide film is formed on both the substrate to be used as the active layer and the support substrate according to the thermal oxidization method to produce the SOI wafer including an overall thick oxide film within a short period of time, regardless of which one of the substrates the ion implantation layer is formed on, the ion implantation layer is deemed to disappear, as can be understood.

(B) Even when the ion implantation layer is formed on the substrate to be used as the active layer, by subsequently forming an oxide film on the support substrate according to the thermal oxidization method, the ion implantation layer is prevented from being disappeared. However, the present inventor has found that the following phenomenon occurs in this case. That is to say, in the process of forming the oxide film on the support substrate according to the thermal oxidization method, oxygen diffused into the support substrate results in creation of a $SiO_x$ region (x<2) having a positively charged fixed charge in the vicinity of an interface of the support substrate with respect to the oxide film, and resistance varies significantly in this region.

Moreover, surprisingly, it has been revealed that, when the support substrate and the substrate to be used as the active layer are bonded together (in detail, simply bonded together without heating) a layer with variable resistance is formed similarly in the vicinity of an interface of the substrate to be used as the active layer with respect to the oxide film. This is considered to be due to the influence of the fixed charge, because the amount of variance in resistance is far greater than the amount of a dopant diffused from the substrate to be used as the active layer toward the oxide film as a result of high-temperature bonding thermal processing.

(C) Accordingly, the present inventor has studied a method of forming an oxide film other than the thermal oxidization method. Consequently, the present inventor has found that an oxide film may be formed without occurrence of the aforementioned phenomenon, by adopting a method of depositing an oxide film by accelerating and emitting ionized silicon and oxygen to the substrate on which the oxide film is to be formed while heating the substrate. An oxide film of an SOI wafer is known to be formed by using a deposition technology, such as a chemical vapor deposition (CVD) method and an atomic layer deposition (ALD) method. However, the method of accelerating and emitting ionized silicon and oxygen while the temperature of the substrate is maintained at a high temperature is applied first time to form an oxide film of the bonded SOI wafer by the present inventor who has developed a dedicated device for this purpose.

(D) Furthermore, bonding the substrate to be used as the active layer and the support substrate by way of normal-temperature vacuum bonding, not by way of the bonding thermal processing, prevents a dopant contained in the substrate to be used as the active layer from being diffused toward the oxide film. This in turn prevents the resistance variance occurring due to thermal diffusion of the dopant in the vicinity of the interface of the substrate to be used as the active layer with respect to the oxide film, and consequently, the resistance variance in the thickness direction of the active layer is further reduced.

Aspects and some embodiments of the present disclosure conceived based on the above findings are as follows.

(1) An SOI wafer manufacturing process, including:

a first step of implanting light element ions to a surface of at least one of a first substrate made of silicon single crystal and a second substrate made of silicon single crystal to form, in the at least one of the first substrate and the second substrate, a modified layer in which the light element ions are present in solid solution;

a second step of forming an oxide film on a surface of at least one of the first substrate and the second substrate;

a third step of bonding the first substrate and the second substrate in a manner such that the modified layer and the oxide film are located between the first substrate and the second substrate; and a fourth step, performed after the third step, of thinning the first substrate to obtain an active layer, wherein, in the second step, the oxide film is deposited by accelerating and emitting ionized Si and oxygen to the at least one of the first substrate and the second substrate while heating the at least one of the first substrate and the second substrate, and in the third step, the first substrate and the second substrate are bonded together at a normal temperature by emitting an ion beam or a neutral atomic beam to surfaces to be bonded of the first substrate and the second substrate under vacuum to activate the surfaces and subsequently by contacting the surfaces to be bonded with each other under vacuum.

Hereinafter, a method of forming the oxide film in the second step is called the "ionization deposition method", and a method of bonding in the third step is called the "normal-temperature vacuum bonding method" in the present disclosure.

(2) The SOI wafer manufacturing process according to (1), wherein, in the second step, the at least one of the first substrate and the second substrate has a temperature of from 500° C. to 900° C.

(3) The SOI wafer manufacturing process according to (1) or (2), wherein, in the first step, the modified layer is formed only in the second substrate.

(4) The SOI wafer manufacturing process according to any one of (1) to (3), wherein, in the second step, the oxide film is formed only on the second substrate.

(5) The SOI wafer manufacturing process according to any one of (1) to (3), wherein, in the second step, the oxide film is formed on both the first substrate and the second substrate.

(6) The SOI wafer manufacturing process according to any one of (1) to (5), wherein, the first substrate is an epitaxial silicon wafer including a bulk silicon substrate and a silicon epitaxial layer formed on a surface of the bulk silicon substrate, and, in the fourth step, the bulk silicon substrate is removed to obtain the active layer formed by the silicon epitaxial layer.

(7) The SOI wafer manufacturing process according to (6), wherein a surface of the silicon epitaxial layer is mirror-polished before the third step.

(8) The SOI wafer manufacturing process according to (6) or (7), wherein the silicon epitaxial layer in the first substrate has a thickness that is determined in consideration of a desired thickness of the active layer and a thickness of an oxygen diffusion region formed by oxygen diffusion from the bulk silicon substrate into the silicon epitaxial layer, and, in the fourth step, the oxygen diffusion region in the silicon epitaxial layer is also removed.

(9) The SOI wafer manufacturing process according to any one of (1) to (8), wherein the light element ions include at least one selected from H, He, C, Ar, and Si.

(10) An SOI wafer including a support substrate made of silicon single crystal, an oxide film located above the support substrate, and an active layer located above the oxide film and made of silicon single crystal, the SOI wafer further including:

a modified layer in which a light element is present in solid solution, the modified layer being located in a vicinity of an interface of at least one of the active layer and the support substrate with respect to the oxide film, wherein the active layer in a thickness direction thereof has a resistivity distribution in which {(maximum value−minimum value)/(minimum value)×100} is 20% or less.

(11) The SOI wafer according to (10), wherein a result of TZDB measurement performed under a judgement current of $1 \times 10^{-4}$ A/cm$^2$ is 8 MV/cm$^2$ or more.

(12) The SOI wafer according to (10) or (11), wherein the modified layer is located only in the vicinity of the interface of the support substrate with respect to the oxide film.

(13) The SOI wafer according to any one of (10) to (12), wherein the oxide film has a thickness of 10 μm or more.

(14) The SOI wafer according to any one of (10) to (13), wherein the active layer is composed of a silicon epitaxial layer.

(15) The SOI wafer according to any one of (10) to (14), wherein the light element includes at least one selected from H, He, C, Ar, and Si.

The SOI wafer manufacturing process according to the present disclosure allows production of an SOI wafer having a high gettering ability and a small resistance variance in the thickness direction of the active layer, at high productivity. An SOI wafer according to the present disclosure has a high gettering ability and a small resistance variance in the thickness direction of the active layer.

DETAILED DESCRIPTION (First Embodiment)

Figure 1:
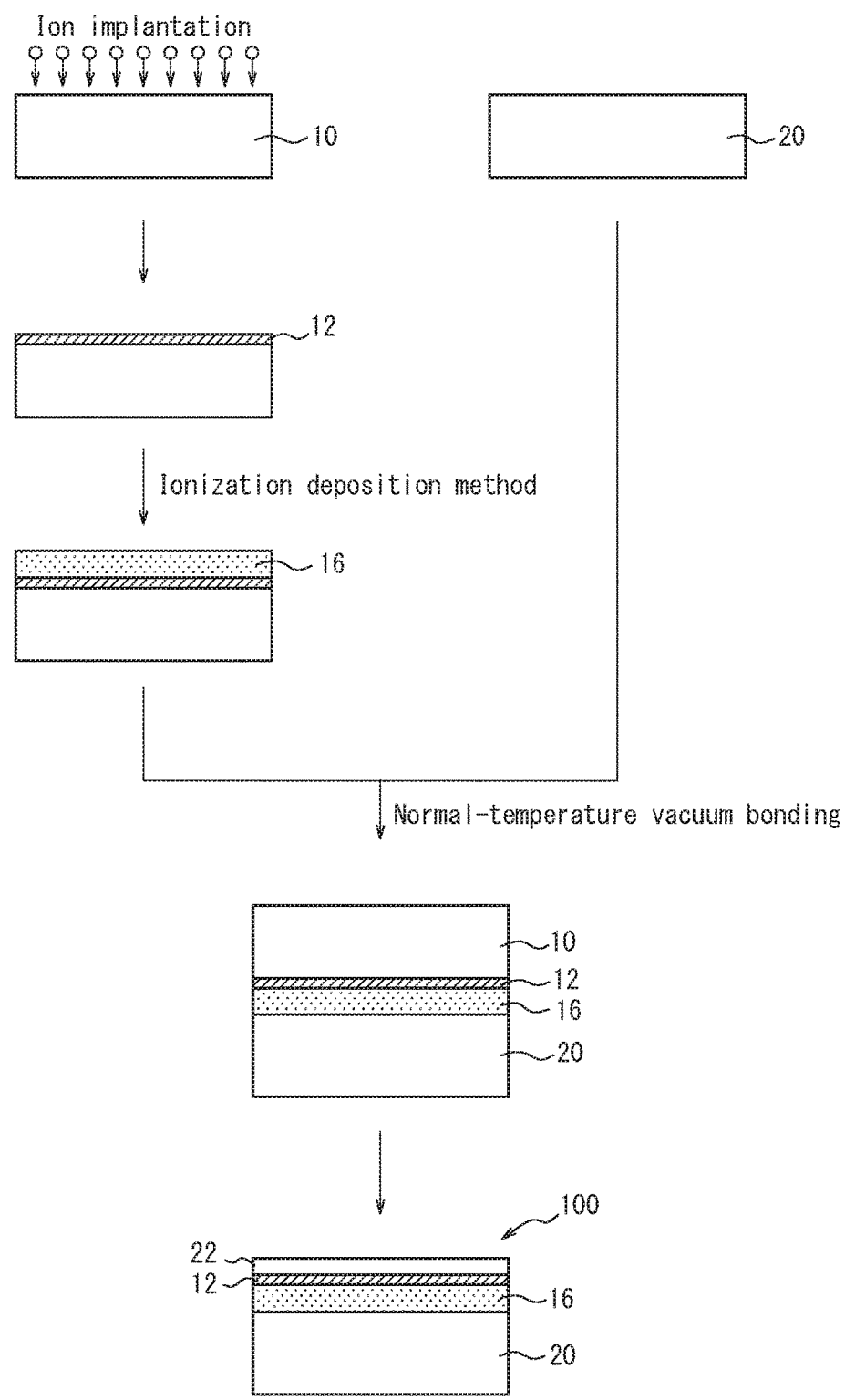
FIG. 1 is a schematic sectional view illustrating an SOI wafer manufacturing process according to the first embodiment of the present disclosure.

With reference to FIG. 1, a description is given of the first embodiment of the present disclosure. In the present embodiment, firstly, light element ions are implanted to a surface of a substrate (i.e., the first substrate) 10 to be used as an active layer to form, in the substrate 10 to be used as the active layer, a modified layer 12 in which the light element ions are present in solid solution. Subsequently, an oxide film 16 is formed on the surface of the substrate 10 to be used as the active layer according to the ionization deposition method. After that, the substrate 10 to be used as the active layer and a support substrate (i.e., the second substrate) 20 are bonded together in a manner such that the modified layer 12 and the oxide film 16 are located between the substrate 10 to be used as the active layer and the support substrate 20, according to the normal-temperature vacuum bonding method. Subsequently, the substrate 10 to be used as the active layer is thinned to obtain the active layer 22.

In this way, an SOI wafer 100 is obtained. The SOI wafer 100 includes the support substrate 20, the oxide film 16 located above the support substrate 20, and the active layer 22 located above the oxide film 16, and, in the vicinity of an interface of the active layer 22 with respect to the oxide film 16, the SOI wafer 100 also includes the modified layer 12 in which the light element is present in solid solution.

(Second Embodiment)

Figure 2:
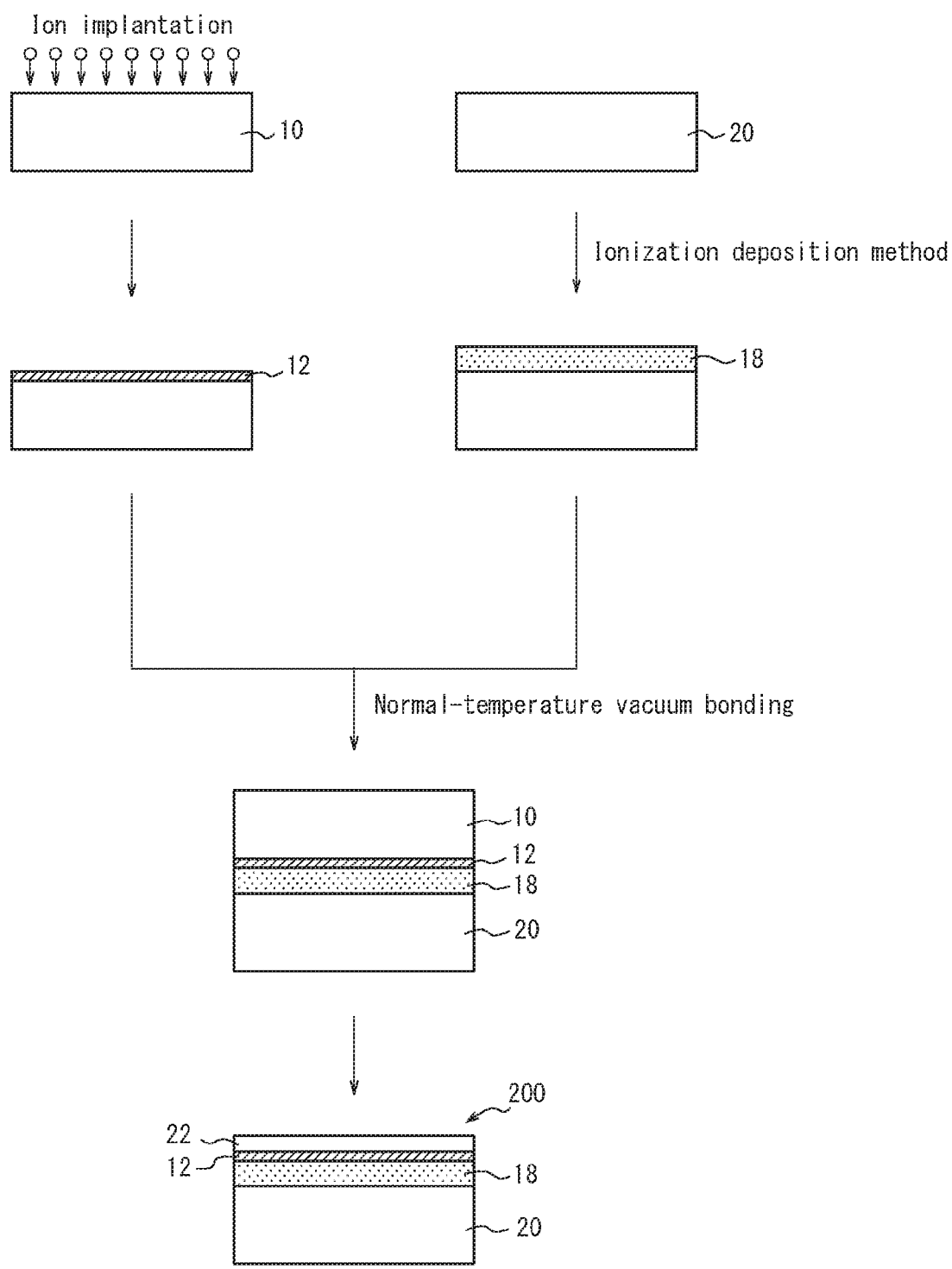
FIG. 2 is a schematic sectional view illustrating an SOI wafer manufacturing process according to the second embodiment of the present disclosure.

With reference to FIG. 2, a description is given of the second embodiment of the present disclosure. In the present embodiment, light element ions are implanted to a surface of the substrate (i.e., the first substrate) 10 to be used as the active layer to form, in the substrate 10 to be used as the active layer, the modified layer 12 in which the light element ions are present in solid solution. Furthermore, an oxide film 18 is formed on a surface of the support substrate (i.e., the second substrate) 20 according to the ionization deposition method. After that, the substrate 10 to be used as the active layer and the support substrate 20 are bonded together in a manner such that the modified layer 12 and the oxide film 18 are located between the substrate 10 to be used as the active layer and the support substrate 20, according to the normal-temperature vacuum bonding method. Subsequently, the substrate 10 to be used as the active layer is thinned to obtain the active layer 22.

In this way, an SOI wafer 200 is obtained. The SOI wafer 200 includes the support substrate 20, the oxide film 18 located above the support substrate 20, and the active layer 22 located above the oxide film 18, and, in the vicinity of an interface of the active layer 22 with respect to the oxide film 18, the SOI wafer 200 also includes the modified layer 12 in which the light element is present in solid solution.

(Third Embodiment)

Figure 3:
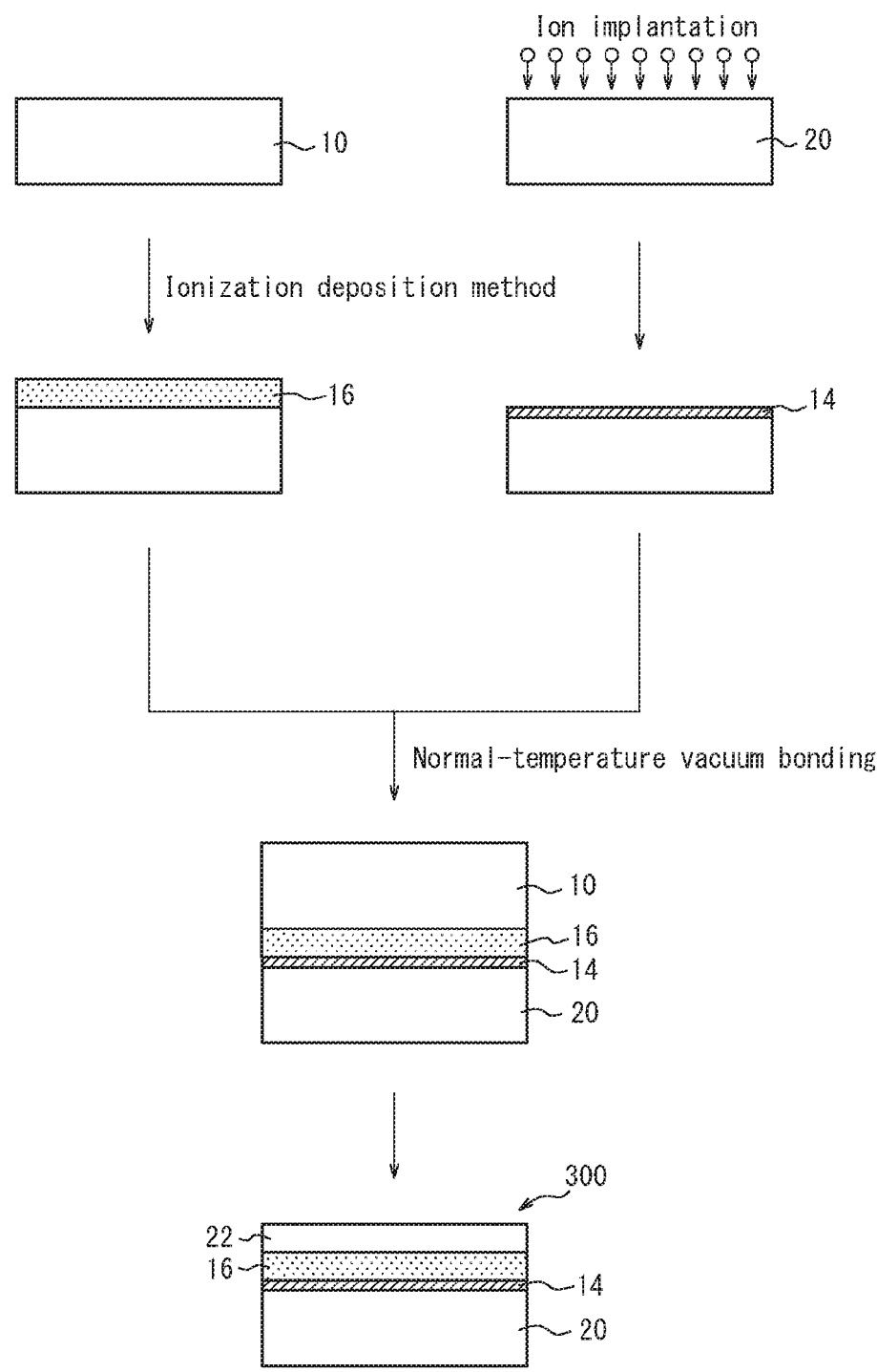
FIG. 3 is a schematic sectional view illustrating an SOI wafer manufacturing process according to the third embodiment of the present disclosure.

With reference to FIG. 3, a description is given of the third embodiment of the present disclosure. In the present embodiment, light element ions are implanted to a surface of the support substrate (i.e., the second substrate) 20 to form, in the support substrate 20, a modified layer 14 in which the light element ions are present in solid solution. Furthermore, the oxide film 16 is formed on a surface of the substrate (i.e., the first substrate) 10 to be used as the active layer by the ionization deposition method. After that, the substrate 10 to be used as the active layer and the support substrate 20 are bonded together in a manner such that the modified layer 14 and the oxide film 16 are located between the substrate 10 to be used as the active layer and the support substrate 20, according to the normal-temperature vacuum bonding method. Subsequently, the substrate 10 to be used as the active layer is thinned to obtain the active layer 22.

In this way, an SOI wafer 300 is obtained. The SOI wafer 300 includes the support substrate 20, the oxide film 16 located above the support substrate 20, and the active layer 22 located above the oxide film 16, and, in the vicinity of an interface of the support substrate 20 with respect to the oxide film 16, the SOI wafer 300 also includes the modified layer 14 in which the light element is present in solid solution.

(Fourth Embodiment)

Figure 4:
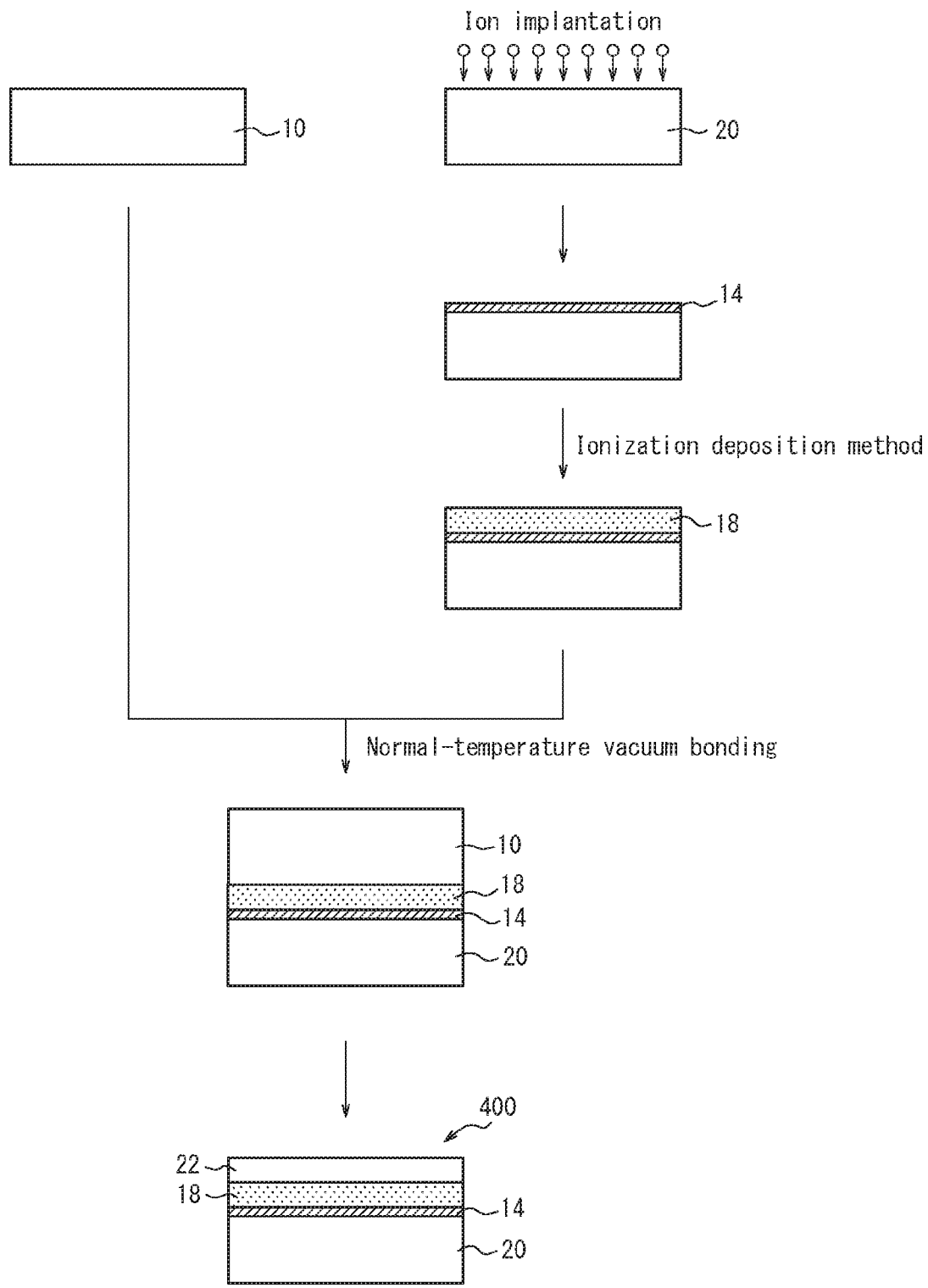
FIG. 4 is a schematic sectional view illustrating an SOI wafer manufacturing process according to the fourth embodiment of the present disclosure.

With reference to FIG. 4, a description is given of the fourth embodiment of the present disclosure. In the present embodiment, firstly, light element ions are implanted to a surface of the support substrate (i.e., the second substrate) 20 to form, in the support substrate 20, a modified layer 14 in which the light element ions are present in solid solution. Subsequently, the oxide film 18 is formed on the surface of the support substrate 20 by the ionization deposition method. After that, the substrate (i.e., the first substrate) 10 to be used as the active layer and the support substrate 20 are bonded together in a manner such that the modified layer 14 and the oxide film 18 are located between the substrate 10 to be used as the active layer and the support substrate 20, according to the normal-temperature vacuum bonding method. Subsequently, the substrate 10 to be used as the active layer is thinned to obtain the active layer 22.

In this way, an SOI wafer 400 is obtained. The SOI wafer 400 includes the support substrate 20, the oxide film 18 located above the support substrate 20, and the active layer 22 located above the oxide film 18, and, in the vicinity of an interface of the support substrate 20 with respect to the oxide film 18, the SOI wafer 400 also includes the modified layer 14 in which the light element is present in solid solution.

(Fifth Embodiment)

Figure 5:
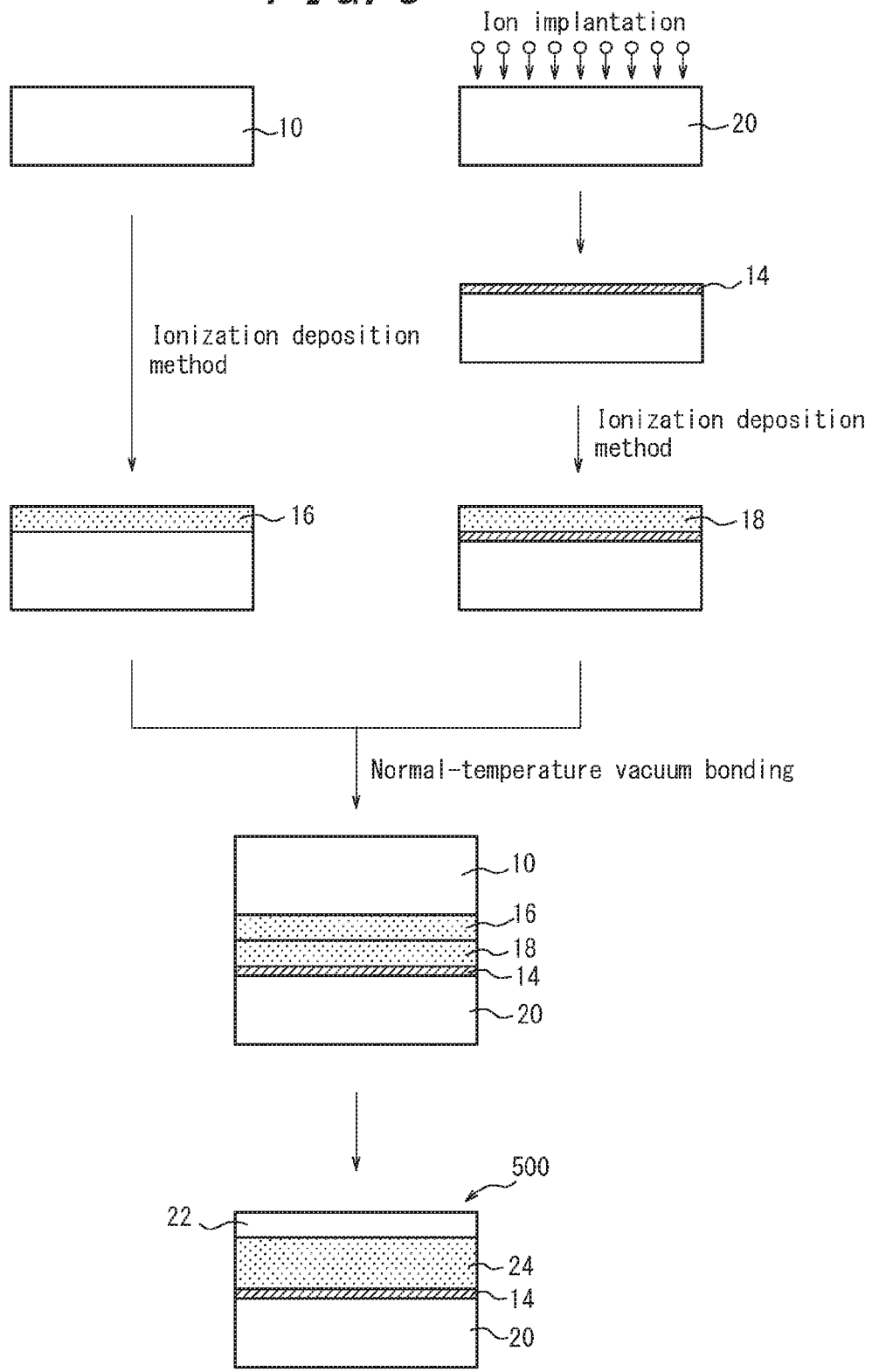
FIG. 5 is a schematic sectional view illustrating an SOI wafer manufacturing process according to the fifth embodiment of the present disclosure.

With reference to FIG. 5, a description is given of the fifth embodiment of the present disclosure. In the present embodiment, firstly, light element ions are implanted to a surface of the support substrate (i.e., the second substrate) 20 to form, in the support substrate 20, the modified layer 14 in which the light element ions are present in solid solution. Subsequently, the oxide film 18 is formed on the surface of the support substrate 20 by the ionization deposition method. Furthermore, the oxide film 16 is also formed on a surface of the substrate (the first substrate) 10 to be used as the active layer by the ionization deposition method. After that, the substrate 10 to be used as the active layer and the support substrate 20 are bonded together in a manner such that the modified layer 14 and the oxide films 16 and 18 are located between the substrate 10 to be used as the active layer and the support substrate 20, according to the normal-temperature vacuum bonding method. Subsequently, the substrate 10 to be used as the active layer is thinned to obtain the active layer 22.

In this way, an SOI wafer 500 is obtained. The SOI wafer 500 includes the support substrate 20, an oxide film 24 located above the support substrate 20, and the active layer 22 located above the oxide film 24, and, in the vicinity of an interface of the support substrate 20 with respect to the oxide film 24, the SOI wafer 500 also includes the modified layer 14 in which the light element is present in solid solution. Note that the oxide film 24 includes the oxide film 16, formed on the substrate 10 to be used as the active layer, and the oxide film 18, formed on the support substrate 20, that are bonded together.

(Sixth Embodiment)

Figure 6:
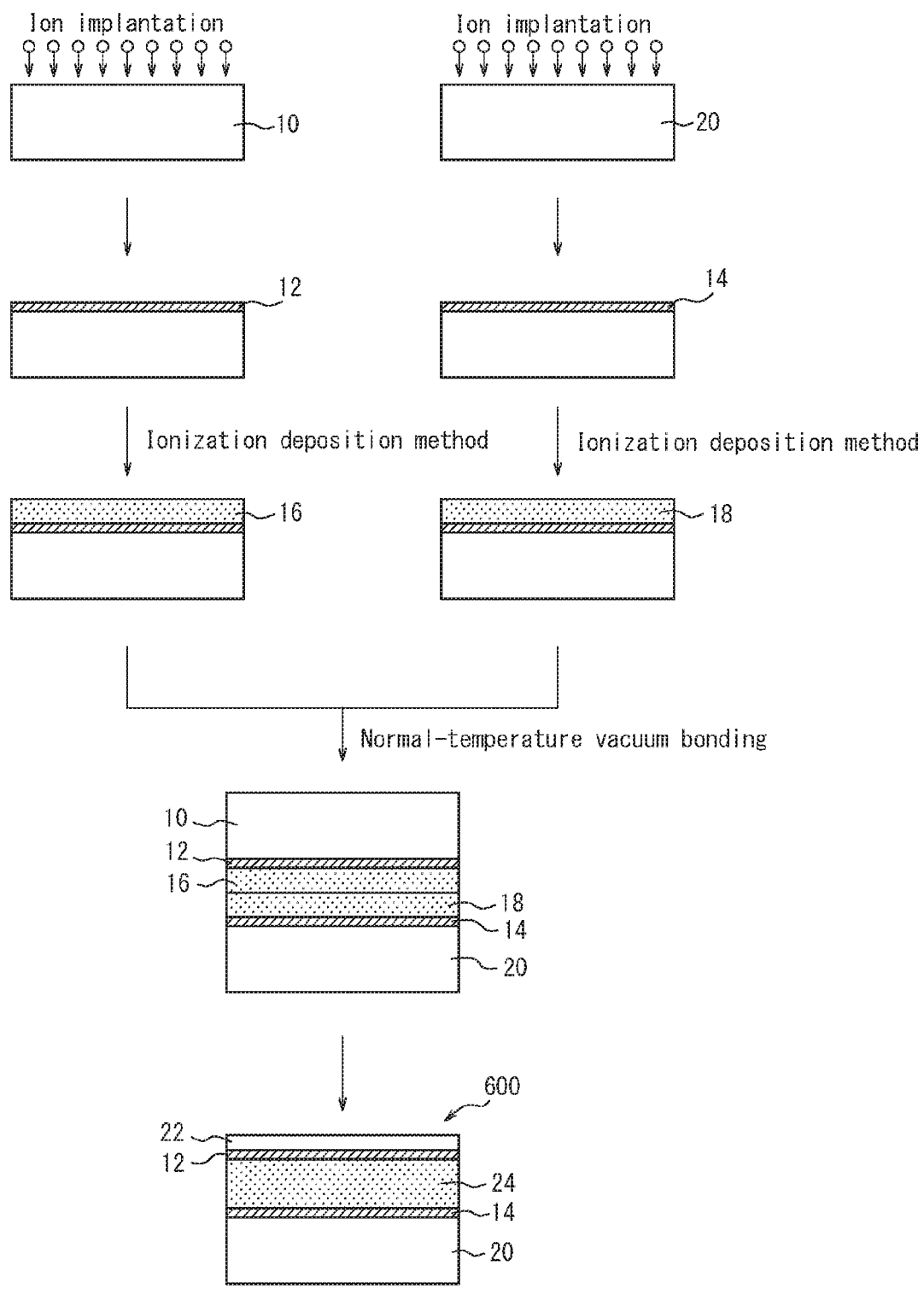
FIG. 6 is a schematic sectional view illustrating an SOI wafer manufacturing process according to the sixth embodiment of the present disclosure.

With reference to FIG. 6, a description is given of the sixth embodiment of the present disclosure. In the present embodiment, firstly, light element ions are implanted to a surface of the substrate (i.e., the first substrate) 10 to be used as the active layer to form, in the substrate 10 to be used as the active layer, the modified layer 12 in which the light element ions are present in solid solution. Subsequently, the oxide film 16 is formed on the surface of the substrate 10 to be used as the active layer by the ionization deposition method. Furthermore, light element ions are implanted to a surface of the support substrate (i.e., the second substrate) 20 to form, in the support substrate 20, the modified layer 14 in which the light element ions are present in solid solution. Subsequently, the oxide film 18 is formed on the surface of the support substrate 20 by the ionization deposition method. After that, the substrate 10 to be used as the active layer and the support substrate 20 are bonded together in a manner such that the modified layers 12 and 14 and the oxide films 16 and 18 are located between the substrate 10 to be used as the active layer and the support substrate 20, according to the normal-temperature vacuum bonding method. Subsequently, the substrate 10 to be used as the active layer is thinned to obtain the active layer 22.

In this way, an SOI wafer 600 is obtained. The SOI wafer 600 includes the support substrate 20, the oxide film 24 located above the support substrate 20, and the active layer 22 located above the oxide film 24, and, in the vicinity of an interface between the active layer 22 with respect to the oxide film 16, the SOI wafer 600 also includes the modified layer 12, and in the vicinity of an interface of the support substrate 20 with respect to the oxide film 24, the SOI wafer 600 also includes the modified layer 14 in which the a light element is present in solid solution. Note that the oxide film 24 includes the oxide film 16, formed on the substrate 10 to be used as the active layer, and the oxide film 18, formed on the support substrate 20, that are bonded together.

(First Step: Formation of Gettering Layer by Ion Implantation)

An element to be ionized may be any light element that contributes to gettering and preferably includes at least one selected from H, He, C, Ar, and Si. The reason is that these elements do not affect electric resistivity of an SOI wafer. By ionizing these elements and implanting the ions to one or both of the substrate 10 to be used as the active layer and the support substrate 20, the modified layers 12 and 14 that contribute to gettering are formed.

Ions to be implanted may be monomer or cluster ions. Herein, "cluster ions" refer to a cluster, that is to say, an aggregate of a plurality of atoms or molecules that are ionized with a positive or a negative charge. A cluster is a group of (normally, approximately from 2 to 2000) agglomerated atoms or molecules bonded to each other. From the viewpoint of achieving a higher gettering ability, cluster ions are preferably implanted.

From the viewpoint of achieving a higher gettering ability, it is preferable to form the modified layer 12 by implanting ions to the substrate 10 to be used as the active layer. The reason is that the modified layer 12 is located closer to the active layer. On the other hand, in applications where the entire region of the active layer is used as a device region, it is preferable to form the modified layer 14 only in the support substrate 20 by implanting ions only to the support substrate 20. In other words, it is preferable not to form a modified layer in the substrate 10 to be used as the active layer. The reason is that, in this case, the presence of the modified layer itself might be a cause of leak failure. Additionally, even when a modified layer is formed only in the support substrate 20, any impurity elements that may pass an oxide film may be captured in the modified layer.

Conditions, such as an accelerating voltage, a dose amount, and a cluster size during emission of cluster ions, applied for ion implantation may be any known or general conditions that may be adopted in consideration of gettering ability. Furthermore, any conventional monomer ion generation device and cluster ion generation device may be used.

(Second Step: Formation of Oxide Film by Ionization Deposition Method)

The ionization deposition method is a method of depositing an oxide film by accelerating and emitting ionized silicon and oxygen to a substrate on which an oxide film is to be formed while heating the substrate. In this method, the oxide film is deposited on the substrate by a combination of accelerating energy of the ionized element and thermal energy of the heated substrate. The method provides an elaborate better-quality oxide film compared with a plasma deposition method only using accelerating energy of an ionized element for deposition and the CVD method only using thermal energy for deposition. In detail, in the state where the temperature of the substrate is maintained at 500° C. or more, silicon and oxygen are ionized through plasma processing and accelerated onto the substrate, and thus, the oxide film is deposited on the substrate.

Figure 8:
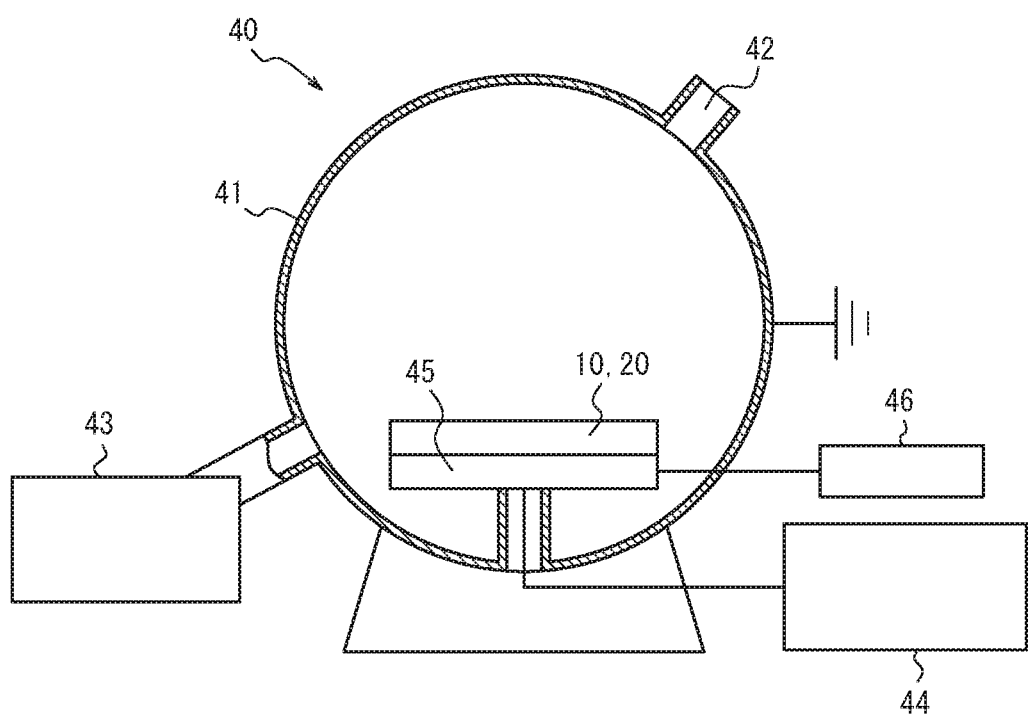
FIG. 8 is a schematic view illustrating a plasma ion emission device used to form an oxide film in embodiments of the present disclosure.

One of embodiments of a device used to implement this method is described with reference to FIG. 8. A plasma ion emission device 40 includes a plasma chamber 41, a gas inlet 42, a vacuum pump 43, a pulse voltage application unit 44, a wafer fixture 45, and a heater 46.

Firstly, the substrate 10 to be used as the active layer and/or the support substrate 20 are/is mounted and fixed to the wafer fixture 45 disposed in the plasma chamber 41. Secondly, the pressure inside the plasma chamber 41 is reduced by the vacuum pump 43, and then, a source gas is introduced into the plasma chamber 41 through the gas inlet 42. Subsequently, after the wafer fixture 45 is heated by the heater 46, a pulsed negative voltage is applied to the wafer fixture 45 (and to the substrates 10 and 20) by the pulse voltage application unit 44. Thus, source gas plasma including silicon and oxygen is generated, and source gas ions contained in the generated plasma are accelerated and emitted toward the substrates 10 and 20. The emitted silicon ions and oxygen ions react on the substrate, and the oxide film is deposited.

The source gas may include one, or two or more, of monosilane, dichlorosilane, trichlorosilane, trimethylsilane, silicone tetrachloride, or the like as a silicon source and may also include oxygen as an oxygen source.

The chamber pressure inside the plasma chamber 41 is 100 Pa or less. With a chamber pressure of more than 100 Pa, plasma is unstabilized, and the plasma state is not maintained.

Herein, the pulse voltage applied to the substrates 10 and 20 is set so that the accelerating energy of silicon and oxygen with respect to the surface of the substrate is from 10 eV to 1 keV. With an accelerating energy of less than 10 eV, bonding energy between silicon and oxygen is insufficient, and this might hinder formation of the oxide film. On the other hand, with an accelerating energy of more than 1 keV, silicon and oxygen are implanted from the surface to the inside of the substrate, and this hinders formation of the oxide film.

The frequency of the pulse voltage determines the number of times ions are emitted to the substrates 10 and 20. The frequency of the pulse voltage is preferably from 10 Hz to 50 kHz. Herein, with a frequency of 10 Hz or more, variation in ion emission is absorbed, and this stabilizes the amount of emitted ions. With a frequency of 50 kHz or less, glow discharge plasma is formed stably.

The pulse width of the pulse voltage determines a time period over which ions are emitted to the substrates 10 and 20. The pulse width is preferably from 1 μsecond (microsecond) to 10 m seconds (miliseconds). With a pulse width of 1 μsecond or more, ions are emitted to the substrates 10 and 20 stably. With a pulse width of 10 m seconds or less, glow discharge plasma is formed stably.

The accelerating energy of ions is controlled mainly by the applied voltage. Furthermore, as supplementary control, resistance between the wafer and the pulse application unit (e.g., resistance of the fixture, and resistance between the fixture and the pulse application unit), and timing of voltage application may be adjusted, and by doing so, the distance between a plasma region and the wafer may be adjusted.

The temperature of a substrate is preferably 500° C. or more. Generally, when an oxide film is formed according to the CVD method, the temperature of the substrates is set to be a low temperature of from approximately 100° C. to 300° C., and accordingly, an elaborate oxide film is hardly obtained, and deterioration in quality of the oxide film and peeling of the film at the time of bonding thermal processing are more likely to occur compared with cases according to the thermal oxidization method. By setting the temperature of the substrate to be 500° C. or more, an elaborate good-quality oxide film may be formed. This in turn improves pressure-resistance characteristics of the oxide film.

The temperature of the substrate is preferably 900° C. or less. By setting the temperature of the substrate to be 900° C. or less, a dopant contained in the active layer is prevented from being diffused to the oxide film, and thus, a decrease in dopant concentration in the vicinity of the active layer with respect to the oxide film is prevented. Furthermore, an element implanted in a modified layer is prevented from being diffused through the active layer, and thus, a non-uniform concentration profile of the implanted element in the thickness direction of the active layer and a resulting decrease in gettering ability are prevented.

Forming an oxide film according to the ionization deposition method described above provides the following operational advantages. Firstly, since, unlike the thermal oxidization method, the ionization deposition method does not consume silicon in the superficial portion of a substrate, the problem described in the findings (A) that a modified layer might disappear is avoided. Accordingly, an SOI wafer having a high gettering ability may be obtained. Secondly, unlike the thermal oxidization method, the ionization deposition method does not create a layer with variable resistance due to the fixed charge, in the vicinity of a substrate with respect to the oxide film, and therefore, the problem described in the findings (B) is avoided. Accordingly, an SOI wafer having a small resistance variance in the thickness direction of the active layer may be obtained.

Furthermore, although the thermal oxidization method takes 1 or more months to form an oxide film of from 5 to 10 μm, the ionization deposition method is much faster in film formation rate, taking approximately 3 hours to form an oxide film of the same thickness. Accordingly, productivity is improved. The ionization deposition method is very effective for forming a thick oxide film.

An oxide film may be formed on one or both of the substrate 10 to be used as the active layer and the support substrate 20. From the viewpoint of obtaining an overall thick oxide film within a short period of time, an oxide film is preferably formed on both the substrate 10 to be used as the active layer and the support substrate 20. The substrate 10 to be used as the active layer is required to be highly pure since it is used as the device region. From the viewpoint of reducing the chance for the substrate 10 to be used as the active layer to be exposed to impurity contamination to the minimum possible, an oxide film is preferably formed only on the support substrate 20 which is not used as the device region, so that the influence of impurity contamination from the device may be eliminated to the minimum possible level.

(Third Step: Bonding According to Normal-Temperature Vacuum Bonding Method)

The normal-temperature vacuum bonding method is a method of bonding the substrate 10 to be used as the active layer and the support substrate 20 at a normal temperature without heating the substrates. In detail, an ion beam or a neutral atomic beam is emitted to a surface to be bonded of each of the substrate 10 to be used as the active layer and the support layer 20 under vacuum, thereby activating the surfaces to be bonded. Consequently, dangling bonds (bonding hands), which are inherent in silicon, appear on the surfaces to be bonded. Accordingly, when the surfaces to be bonded are brought into contact under vacuum afterward, bonding force acts momentarily, and the two substrates are bonded firmly.

Methods of activating the surfaces to be bonded may include a method of accelerating an element, ionized in a plasma atmosphere, to the surfaces of the substrates, and a method of accelerating an ionized element from an ion beam device to the surfaces of the substrate.

Figure 9:
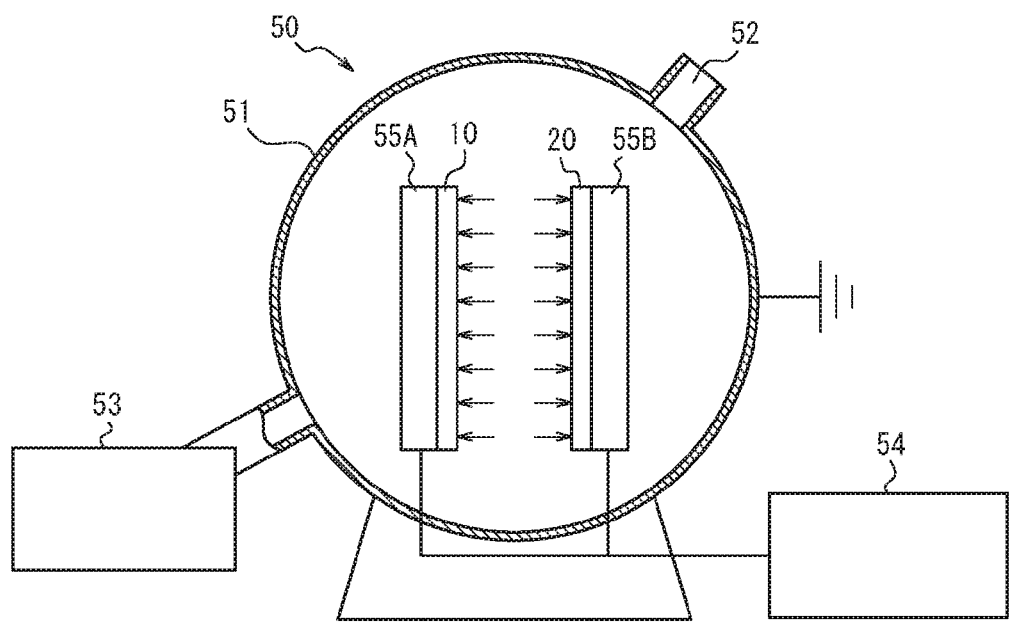
FIG. 9 is a schematic view illustrating a device used for normal-temperature vacuum bonding in embodiments of the present disclosure.

One of embodiments of a device used to implement such a method is described with reference to FIG. 9. A normal-temperature vacuum bonding device includes a plasma chamber 51, a gas inlet 52, a vacuum pump 53, a pulse voltage application unit 54, and wafer fixtures 55A and 55B.

Firstly, the substrate 10 to be used as the active layer and the support substrate 20 are respectively mounted and fixed to the wafer fixtures 55A and 55B disposed in the plasma chamber 51. Secondly, the pressure inside the plasma chamber 51 is reduced by the vacuum pump 43, and then, a source gas is introduced into the plasma chamber 51 through the gas inlet 52. Subsequently, a pulsed negative voltage is applied to the wafer fixtures 55A and 55B (and to the substrates 10 and 20) by the pulse voltage application unit 54. Thus, source gas plasma is generated, and source gas ions contained in the generated plasma are accelerated and emitted toward the substrates 10 and 20.

An element to be emitted preferably includes at least one selected from Ar, Ne, Xe, H, He, and Si.

The chamber pressure inside the plasma chamber 51 is preferably $1 \times 10^{-5}$ Pa or less. The reason is that an element sputtered to the surfaces of the substrates might adhere again, possibly leading to a decrease in formation rate of dangling bonds.

Herein, the pulse voltage applied to the substrates 10 and 20 is set so that the accelerating energy of an element emitted to the surfaces of the substrates is from 100 eV to 10 keV. With an accelerating energy of less than 100 eV, an emitted element is deposited on the surfaces of the substrates and prevents formation of dangling bonds on the surfaces of the substrates. On the other hand, an accelerating energy of more than 10 keV, an emitted element is implanted into the substrates and prevents formation of dangling bonds on the surfaces of the substrates.

The frequency of the pulse voltage determines the number of times ions are emitted to the substrates 10 and 20. The frequency of the pulse voltage is preferably from 10 Hz to 10 kHz. Herein, with a frequency of 10 Hz or more, variation in ion emission is absorbed, and this stabilized the amount of emitted ions. With a frequency of 10 kHz or less, glow discharge plasma is formed stably.

The pulse width of the pulse voltage determines a time period over which ions are emitted to the substrates 10 and 20. The pulse width is preferably from 1 μsecond (microsecond) to 10 m seconds (miliseconds). With a pulse width of 1 μsecond or more, ions are emitted to the substrates 10 and 20 stably. With a pulse width of 10 m seconds or less, glow discharge plasma is formed stably.

The temperatures of the substrates 10 and 20, which are not heated, are normal temperatures (normally from 30° C. to 90° C.).

By combining the formation of an oxide film according to the aforementioned ionization deposition method and the bonding according to the aforementioned normal-temperature vacuum bonding method, the present disclosure provides the following operational effects. In the normal-temperature vacuum bonding method, the substrates are not heated when being bonded. Accordingly, a dopant contained in the substrate to be used as the active layer is prevented from being diffused toward the oxide film. This prevents the resistance variance occurring due to thermal diffusion of the dopant in the vicinity of the interface of the substrate to be used as the active layer with respect to the oxide film, and consequently, the resistance variance in the thickness direction of the active layer is further reduced. Furthermore, an element implanted in a modified layer is prevented from being diffused through the active layer, and thus, a non-uniform concentration profile of the implanted element in the thickness direction of the active layer and a resulting decrease in gettering ability are prevented. Moreover, occurrence of warpage of the bonded SOI wafer caused due to a difference in coefficient of thermal expansions of Si and $SiO_2$ is prevented.

In cases where an oxide film is formed on both the substrate 10 to be used as the active layer and the support substrate 20, the oxide films are bonded to each other in the third step, and bonding strength tends to be weakened. To reinforce bonding strength in view of the above, measures such as the following are preferably adopted.

For instance, a constant voltage may be applied at the time of bringing the substrates 10 and 20 closer to each other for bonding after the surfaces to be bonded are activated. This causes attractive force to act during the bonding of the substrates and reinforces the bonding. The voltage is preferably applied so that an electric field intensity of from 0.1 to 3 MV/cm may be generated. With an electric field intensity of 0.1 MV/cm or more, the effect of reinforcing the bonding may be achieved satisfactorily. With an electric field intensity of 3 MV/cm or less, deterioration of the oxide films is prevented, and the pressure-resistance characteristics are not adversely affected.

(Fourth Step: Thinning of Substrate to be Used as Active Layer)

In a thinning step, preferably, well-known plane-polishing and mirror-polishing methods may be used. Other thinning technologies, such as a well-known smart-cut method, may also be used in the thinning step. After the third step, a surface side of the substrate 10 to be used as the active layer is subject to grinding processing to be thinned, and then, the surface is mirror-polished to obtain an SOI wafer having the active layer of a desired thickness.

(Support Substrate)

As the support substrate 20, a single crystal silicon wafer made of silicon single crystal may be used. The single crystal silicon wafer may be the one obtained by slicing, by a wire saw or the like, a single crystal silicon ingot grown by the Czochralski (CZ) method or the floating zone (FZ) melting method. Furthermore, to achieve an even higher gettering ability, carbon and/or nitrogen may be added. Moreover, any impurity may be added to make the substrate n-type or p-type.

(Substrate to be Used as Active Layer)

The substrate 10 to be used as the active layer is a wafer to be used as a device active layer, and similarly to the support substrate 20, a single crystal silicon wafer made of silicon single crystal may be used.

As the substrate 10 to be used as the active layer, it is also possible to use an epitaxial silicon wafer including a bulk silicon substrate and a silicon epitaxial layer formed on a surface of the bulk silicon substrate. The silicon epitaxial layer 14 may be formed by the CVD method under common conditions, and the thickness of the silicon epitaxial layer 14 is preferably in the range of from 0.1 to 20 µm, more preferably in the range of from 0.2 to 5 µm.

In cases where the substrate 10 to be used as the active layer is the epitaxial silicon wafer and where a modified layer is formed in the epitaxial silicon wafer by ion implantation, and/or, an oxide film is formed on the epitaxial silicon wafer by the ionization deposition method, the modified layer and/or the oxide film are/is formed in/on the silicon epitaxial layer. In the fourth step (the step of thinning the substrate to be used as the active layer), the bulk silicon substrate is removed. In this way, in the embodiments, the active layer 22 may be formed by the silicon epitaxial layer, and crystal quality of the active layer is improved.

Additionally, if an epitaxial layer is formed on the surface of the active layer 22 after bonding, oxygen contained in the active layer 22 is diffused to the epitaxial layer due to high-temperature thermal processing during epitaxial growth. When the epitaxial layer is used as it is as the active layer, in the device process, oxygen donors might be generated in the epitaxial layer and adversely affect resistivity in the epitaxial layer.

Preferably, the surface of the silicon epitaxial layer is mirror-polished before the third step (the bonding step), since, by doing so, bonding strength may be reinforced.

In cases where the substrate 10 to be used as the active layer is the epitaxial silicon wafer, the thickness of the silicon epitaxial layer is preferably determined in consideration of a desired thickness of the active layer and the thickness of an oxygen diffusion region formed by oxygen diffusion from the bulk silicon substrate into the silicon epitaxial layer, and in the fourth step (the thinning step), the oxygen diffusion region in the silicon epitaxial layer is preferably also removed. For example, suppose cases where the active layer of 10 µm is required and where the oxygen diffusion region with a thickness of 1 µm is generated within the epitaxial layer in the process of epitaxial growth. In these cases, the epitaxial layer of 11 µm may be formed, and after bonding, may be thinned to remove the oxygen diffusion region. By doing so, the active layer without the oxygen diffusion region is obtained.

As the bulk silicon substrate on which the epitaxial layer is formed, a low oxygen ($9 \times 10^{17}$ atoms/cm$^3$ or less) silicon wafer and/or a high resistance (100 Ωcm or more) silicon wafer are/is preferably used. Oxygen contained in the bulk silicon substrate is prevented from being diffused to the epitaxial layer due to high-temperature thermal processing during epitaxial growth. Furthermore, high resistance prevents a resistance variance occurring in the epitaxial layer due to a dopant contained in the bulk silicon substrate being diffused to the epitaxial layer.

(SOI Wafer)

Next, a description is given of SOI wafers according to the present embodiments obtained by the manufacturing process described above. As typically illustrated in FIGS. 1 to 6, SOI wafers according to the present embodiments each include the support substrate 20 made of silicon single crystal, the oxide film 16, 18, or 24 located above the support substrate 20, and the active layer 22 located above the oxide film 16, 18, or 24 and made of silicon single crystal.

In the vicinity of an interface of at least one of the active layer 22 and the support substrate 20 with respect to an oxide film, each SOI wafer also includes a modified layer in which a light element is present in solid solution. The active layer 22 in the thickness direction thereof is characterized by having a resistivity distribution in which {(the maximum value−the minimum value)/(the minimum value)×100} is 20% or less and is more preferably 15% or less. The value is smaller the better, and the lower limit of the value may be 0%. As described above, such an SOI wafer that has a high gettering ability and a small resistance variance in the thickness direction of the active layer is obtained by combining the formation of the modified layer by ion implantation, the formation of an oxide film according to the ionization deposition method, and the bonding according to the normal-temperature vacuum bonding method.

By setting the temperature of a substrate to be 500° C. or more during the formation of an oxide film according to the ionization deposition method, pressure-resistance characteristics of the oxide film may be improved. For example, a result of TZDB measurement performed under a judgement current of $1 \times 10^{-4}$ A/cm$^2$ may be 8 MV/cm$^2$ or more.

In cases where the entire region of the active layer is used as the device region, it is preferable to form a modified layer only in the vicinity of the support substrate 20 with respect to an oxide film. In other words, it is preferable not to form a modified layer in the substrate 10 to be used as the active layer. The reason is that, in these cases, the presence of the modified layer itself might be a cause of leak failure.

In applications where the entire region of the active layer is used as the device region, the active layer is formed by the silicon epitaxial layer. By making the active layer entirely formed by the epitaxial layer, crystal quality of the active layer is improved.

When the SOI wafer is used in applications such as a power device, an oxide film preferably has a thickness of 10 µm or more. In this case, an oxide film is preferably formed on both the substrate 10 to be used as the active layer and the support substrate 20.

EXAMPLES (Manufacturing Procedure)

According to conditions described in Table 1, SOI wafers of Examples 1 to 7 and Comparative Examples 1 to 4 were prepared. Firstly, as the substrates to be used as the active layers, as illustrated in Table 1, single crystal silicon wafers (which are each represented as "Si substrate" in Table 1) and epitaxial silicon wafers (which are each represented as "EP-Si" in Table 1) were prepared. As the support substrates, as illustrated in Table 1, single crystal silicon wafers (which are each represented by "Si substrate" in Table 1) were prepared. Phosphor was used as a dopant of the substrates, and dopant concentrations are illustrated in Table 1.

Subsequently, for each SOI wafer, Ar monomer ions were implanted to a surface of at least one of the substrate to be used as the active layer and the support substrate (which is represented as "implanted site" in Table 1) at the corresponding accelerating voltage and dose amount illustrated in Table 1.

Subsequently, according to a method illustrated in Table 1, an oxide film of the corresponding thickness illustrated in Table 1 was formed on a surface of at least one of the substrate to be used as the active layer and the support substrate (which is represented as "formed site" in Table 1). In Comparative Examples 1 and 2, the temperature of the substrates in the thermal oxidization method was 1000° C. In Examples 1 to 7, the oxide film was deposited according to the aforementioned method by using the device illustrated in FIG. 8, and at this time, the temperature of the substrates was 500° C. Regarding plasma conditions, Examples 1 to 5 used 50 sccm of trimethylsilane, 200 sccm of oxygen, a chamber pressure of 10 Pa, an accelerating energy of 150 eV, a frequency of 25 kHz, and a pulse width of $1.5 \times 10^{-3}$ seconds, and Examples 6 and 7 used 45 sccm of trimethylsilane, 150 sccm of oxygen, a chamber pressure of 8 Pa, an accelerating energy of 120 eV, a frequency of 25 kHz, and a pulse width of $1.0 \times 10^{-3}$ seconds.

Subsequently, according to a method illustrated in Table 1, the substrate to be used as the active layer and the support substrate were bonded. As conditions of bonding thermal processing in Comparative Examples 1 to 4, the temperatures of the substrates were set to 800° C. for 2 hours and subsequently set to 1150° C. for 1 hour. In Examples 1 to 7, the substrates were bonded according to the aforementioned method by using the device illustrated in FIG. 9. As conditions of normal-temperature vacuum bonding, the temperature inside the chamber was set to a normal temperature, Ar ions were emitted, and a chamber pressure of $1.0 \times 10^{-6}$ Pa, a frequency of 100 Hz, and a pulse width of $1.0 \times 10^{-3}$ seconds were used. The accelerating energy was 1.0 keV in Examples 1 to 5 and 0.7 keV in Examples 6 and 7.

Subsequently, a surface side of each substrate to be used as the active layer was subject to grinding processing to be thinned, and then, the surface was mirror-polished to obtain the SOI wafers having the active layers of a thickness illustrated in Table 1.

TABLE 1

| Experiment No. | Category | Substrate to be used as active layer — Substrate | Substrate to be used as active layer — Dopant concentration (atoms/cm³) | Support substrate — Substrate | Support substrate — Dopant concentration (atoms/cm³) | Ion implantation — Accelerating voltage (keV/atom) | Ion implantation — Dose amount (cm⁻²) | Ion implantation — Implanted site | Formation of oxide film — Method | Formation of oxide film — Thickness of oxide film | Formation of oxide film — Formed site |
|---|---|---|---|---|---|---|---|---|---|---|---|
| Experiment 1 | Comparative Example 1 | Si substrate | 7.5E+14 | Si substrate | 7.5E+14 | 70 | 5.0E+14 | Substrate to be used as active layer | Thermal oxidization method | 5 μm | Substrate to be used as active layer |
| | Example 1 | Si substrate | 7.5E+14 | Si substrate | 7.5E+14 | 70 | 5.0E+14 | Substrate to be used as active layer | Ionization deposition method (plasma CVD method) | 5 μm | Substrate to be used as active layer |
| Experiment 2 | Comparative Example 2 | Si substrate | 4.5E+14 | Si substrate | 4.5E+14 | 100 | 7.0E+14 | Substrate to be used as active layer | Thermal oxidization method | 5 μm | Support substrate |
| | Example 2 | Si substrate | 4.5E+14 | Si substrate | 4.5E+14 | 100 | 7.0E+14 | Substrate to be used as active layer | Ionization deposition method (plasma CVD method) | 5 μm | Support substrate |
| Experiment 3 | Comparative Example 3 | Si substrate | 4.5E+14 | Si substrate | 4.5E+14 | 80 | 6.0E+14 | Support substrate | Ionization deposition method (plasma CVD method) | 5 μm | Substrate to be used as active layer |
| | Example 3 | Si substrate | 4.5E+14 | Si substrate | 4.5E+14 | 80 | 6.0E+14 | Support substrate | Ionization deposition method (plasma CVD method) | 5 μm | Support substrate |
| Experiment 4 | Comparative Example 4 | Si substrate | 4.5E+14 | Si substrate | 4.5E+14 | 150 | 8.0E+14 | Support substrate | Ionization deposition method (plasma CVD method) | 5 μm | Support substrate |
| | Example 4 | Si substrate | 4.5E+14 | Si substrate | 4.5E+14 | 150 | 8.0E+14 | Support substrate | Ionization deposition method (plasma CVD method) | 5 μm | Support substrate |
| Experiment 5 | Example 5 | EP-Si | 4.5E+14 | Si substrate | 4.5E+14 | 70 | 5.0E+14 | Support substrate | Ionization deposition method (plasma CVD method) | 5 μm | Support substrate |
| Experiment 6 | Example 6 | EP-Si | 4.5E+14 | Si substrate | 4.5E+14 | 70 | 5.0E+14 | Substrate to be used as active layer and support substrate | Ionization deposition method (ALD method) | 100 nm | Substrate to be used as active layer and support substrate |
| Experiment 7 | Example 7 | EP-Si | 4.5E+14 | Si substrate | 4.5E+14 | 70 | 5.0E+14 | Substrate to be used as active layer and support substrate | Ionization deposition method (ALD method) | 100 nm | Substrate to be used as active layer and support substrate |

| Experiment No. | Category | Bonding processing — Bonding Method | Thinning processing — Thickness of active layer | Corresponding figure | Evaluation result — Evaluation of gettering — Ni intentional contamination evaluation | Evaluation result — Evaluation of gettering — Profile of implanted element | Evaluation result — Evaluation of resistance distribution — Resistance variation | Evaluation result — Evaluation of resistance distribution — Resistance variance |
|---|---|---|---|---|---|---|---|---|
| Experiment 1 | Comparative Example 1 | Bonding thermal | 2 μm | — | Pits present | No implantation peak on surface of substrate to be used | 100.7774% | Resistance variance due to fixed charge |

TABLE 1-continued

Figure 7:
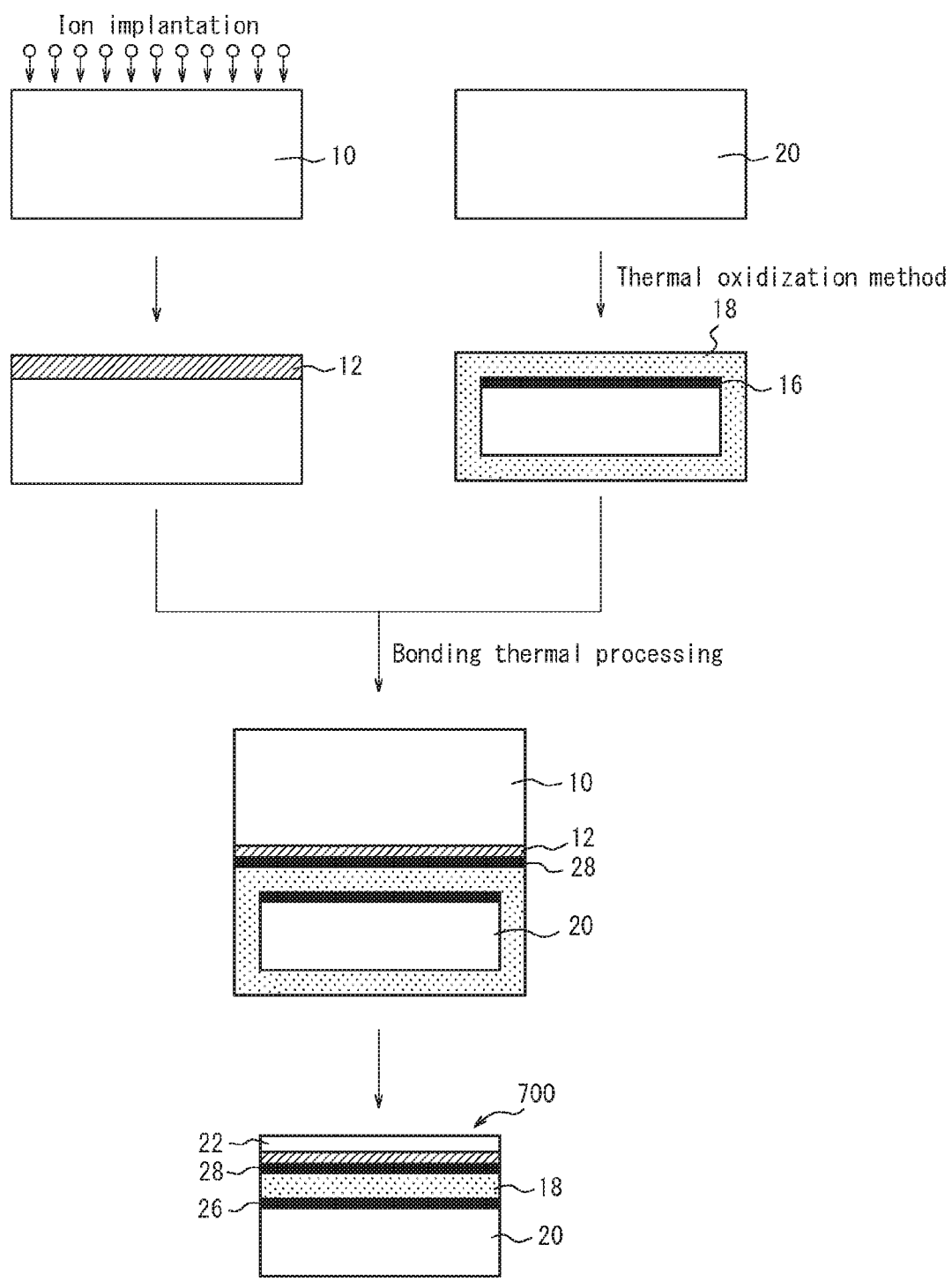
FIG. 7 is a schematic sectional view illustrating an SOI wafer manufacturing process according to Comparative Example 2.

| Experiment | Example | Processing | Thickness | FIG. | Pits | Implantation peak | % | Resistance variance |
|---|---|---|---|---|---|---|---|---|
| | | processing | | | | as active layer (FIG. 10A) | | (FIG. 10B) |
| Experiment 2 | Example 1 | Normal-temperature vacuum bonding | 2 μm | FIG. 1 | Pits absent | Implantation peak on surface of substrate to be used as active layer (FIG. 10A) | 11.3% | No resistance variance (FIG. 10B) |
| | Comparative Example 2 | Bonding thermal processing | 2 μm | FIG. 7 | Pits absent | Implantation peak on surface of substrate to be used as active layer (FIG. 10A) | 1056987% | Resistance variance due to fixed charge (FIG. 11C) |
| Experiment 3 | Example 2 | Normal-temperature vacuum bonding | 2 μm | FIG. 2 | Pits absent | Implantation peak on surface of substrate to be used as active layer (FIG. 11A) | 11.2% | No resistance variance (FIG. 11C) |
| | Comparative Example 3 | Bonding thermal processing | 2 μm | — | Pits absent | Implantation peak on surface of substrate to be used as active layer (FIG. 11A) | 534.5% | Resistance variance due to thermal diffusion (FIG. 12B) |
| Experiment 4 | Example 3 | Normal-temperature vacuum bonding | 2 μm | FIG. 3 | Pits absent | Implantation peak on surface of support substrate | 11.1% | No resistance variance (FIG. 12B) |
| | Comparative Example 4 | Bonding thermal processing | 2 μm | — | Pits absent | Implantation peak on surface of support substrate (FIG. 12B) | 511.5% | Resistance variance due to thermal diffusion (FIG. 13C) |
| Experiment 5 | Example 4 | Normal-temperature vacuum bonding | 2 μm | FIG. 4 | Pits absent | Implantation peak on surface of support substrate (FIG. 13C) | 11.3% | No resistance variance (FIG. 13C) |
| | Example 5 | Normal-temperature vacuum bonding | 2 μm | FIG. 4 | Pits absent | Implantation peak on surface of support substrate | 10.1% | No resistance variance |
| Experiment 6 | Example 6 | Normal-temperature vacuum bonding | 2 μm | FIG. 5 | Pits absent | Implantation peak | 9.8% | No resistance variance |
| Experiment 7 | Example 7 | Normal-temperature vacuum bonding | 2 μm | FIG. 6 | Pits absent | Implantation peak | 11.2% | No resistance variance |

(Evaluation Method)

The following evaluations were conducted for Comparative Examples and Examples.

<Ni Intentional Contamination Evaluation>

A surface of the active layer of the SOI wafer according to each of Comparative Examples and Examples was intentionally contaminated with a Ni contaminated liquid (1.0× $10^{12}/cm^2$) according to the spin coat contamination method, and subsequently, was subject to thermal processing at 900° C. for 1 hour under a nitrogen atmosphere. After that, the sample was immersed in a Wright solution for 3 minutes, and then, the presence of pits (Ni silicide pits) were observed by an optical microscope. Table 1 shows a result of the evaluation.

<Concentration Profile (SIMS Measurement) of Implanted Element after Formation of Oxide Film>

Figure 10A:
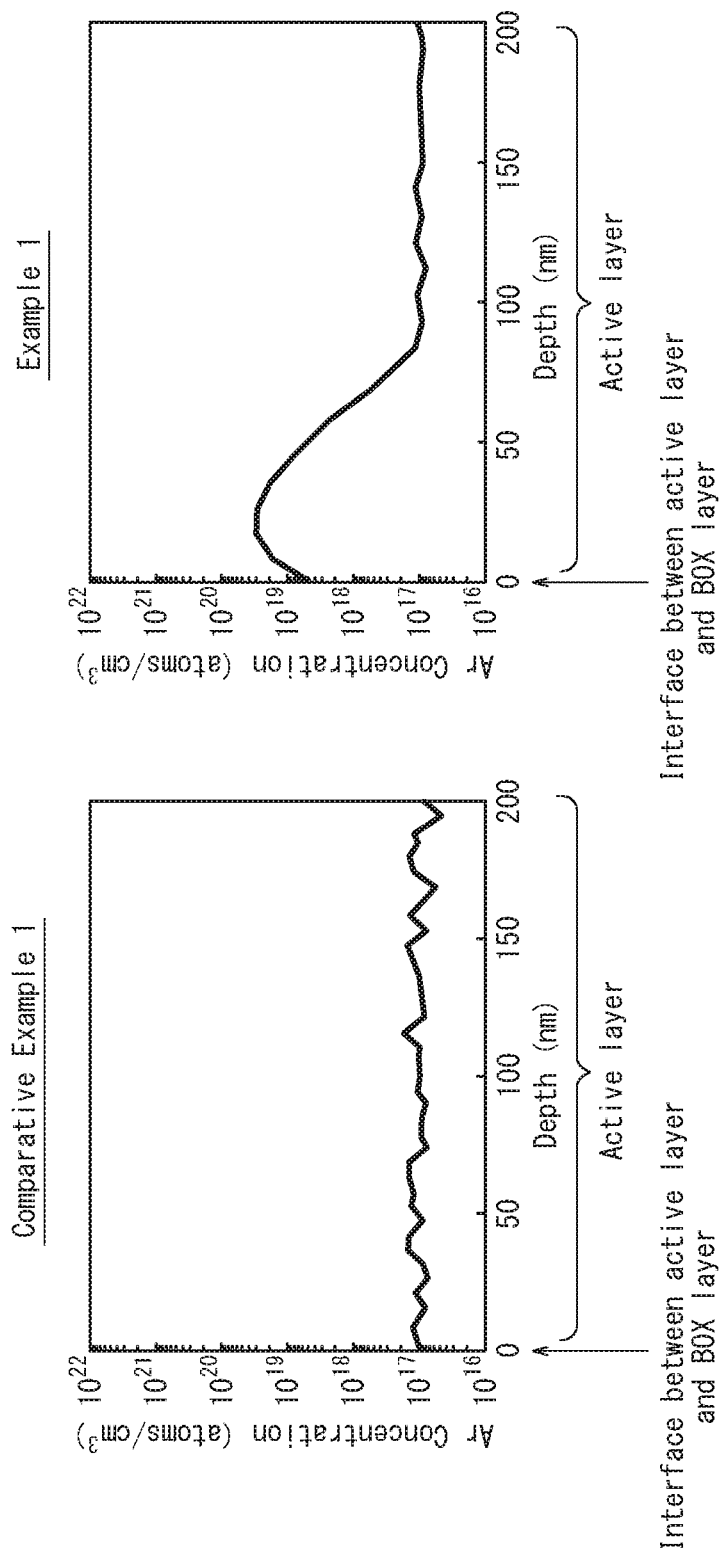
FIG. 10A is graph illustrating concentration profiles of an implanted element after oxide films are formed in Comparative Example 1 and Example 1.
Figure 11A:
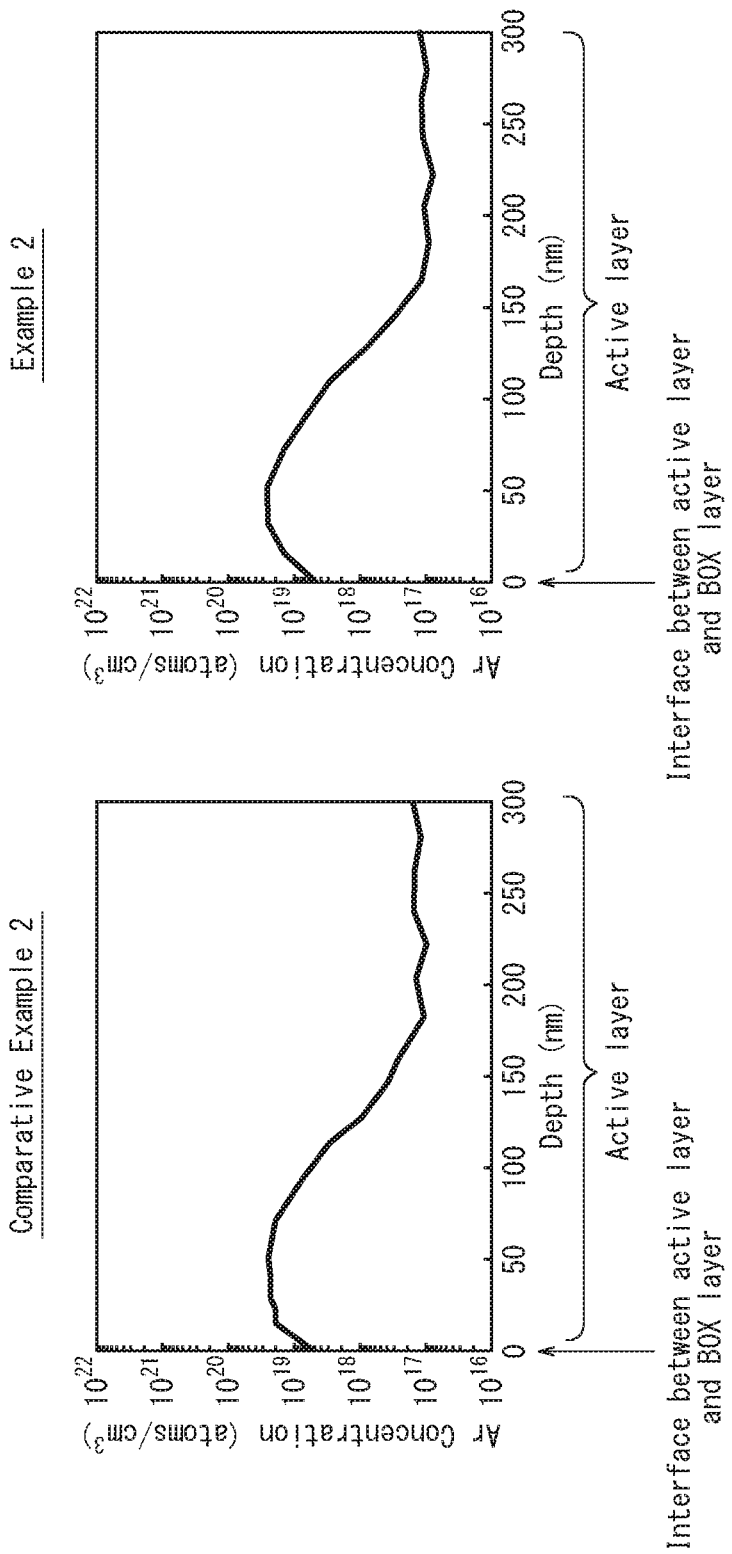
FIG. 11A is graph illustrating concentration profiles of an implanted element after oxide films are formed in Comparative Example 2 and Example 2.
Figure 13A:
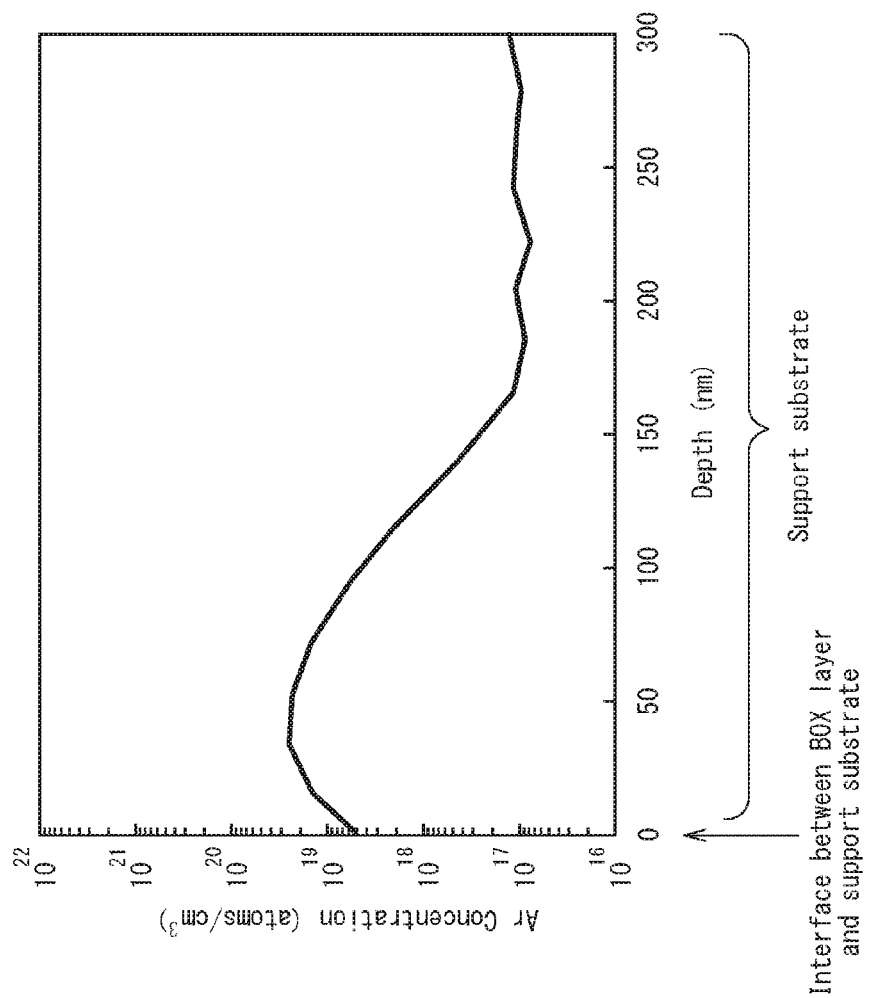
FIG. 13A is graph illustrating a concentration profile of an implanted element after an oxide film is formed in Example 4.

For each of Comparative Examples and Examples, after the formation of an oxide film (after the bonding), a concentration profile of an implanted element in the thickness direction of the substrate implanted with ions was measured according to the secondary ion mass spectrometry (SIMS) method. Table 1 shows the presence of a peak of the implanted element. As representative examples, the concentration profiles of Comparative Example 1 and Example 1 are illustrated in FIG. 10A, the concentration profiles of Comparative Example 2 and Example 2 are illustrated in FIG. 11A, and the concentration profile of Example 4 is illustrated in FIG. 13A.

<Dopant Concentration Profile (SIMS Measurement) in Active Layer>

Figure 11B:
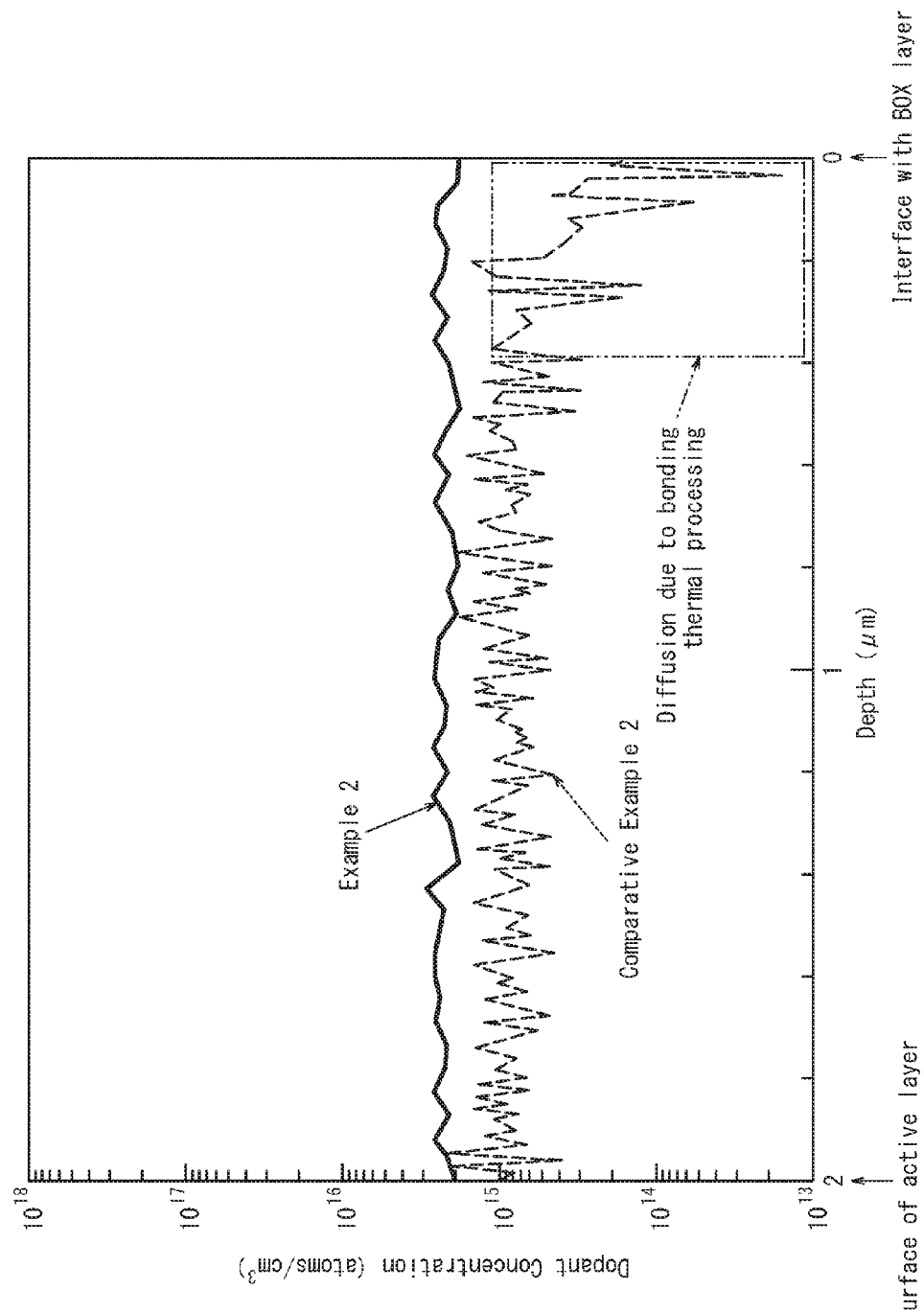
FIG. 11B is graph illustrating dopant concentration profiles in active layers in Comparative Example 2 and Example 2.
Figure 12A:
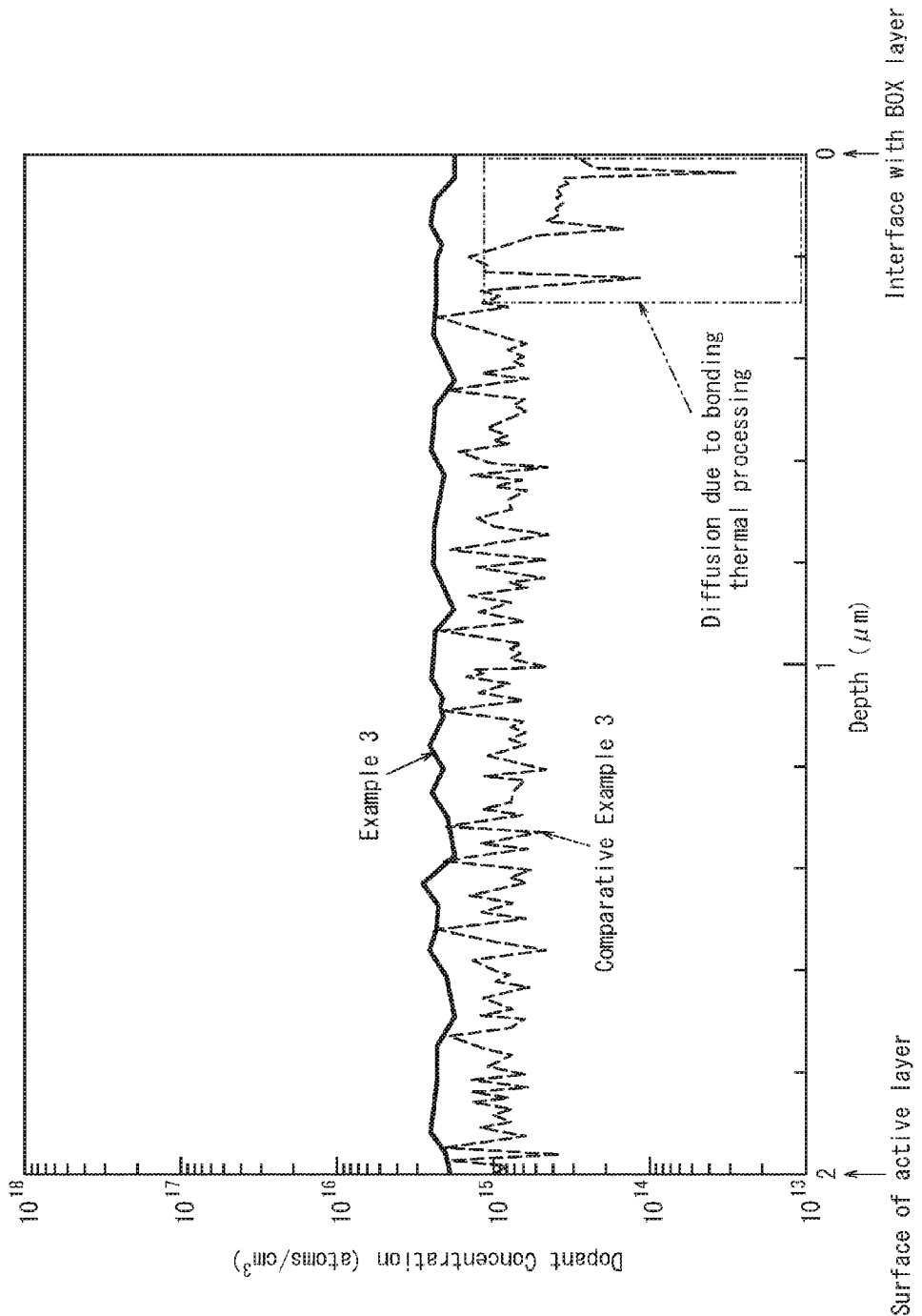
FIG. 12A is graph illustrating dopant concentration profiles in active layers in Comparative Example 3 and Example 3.
Figure 13B:
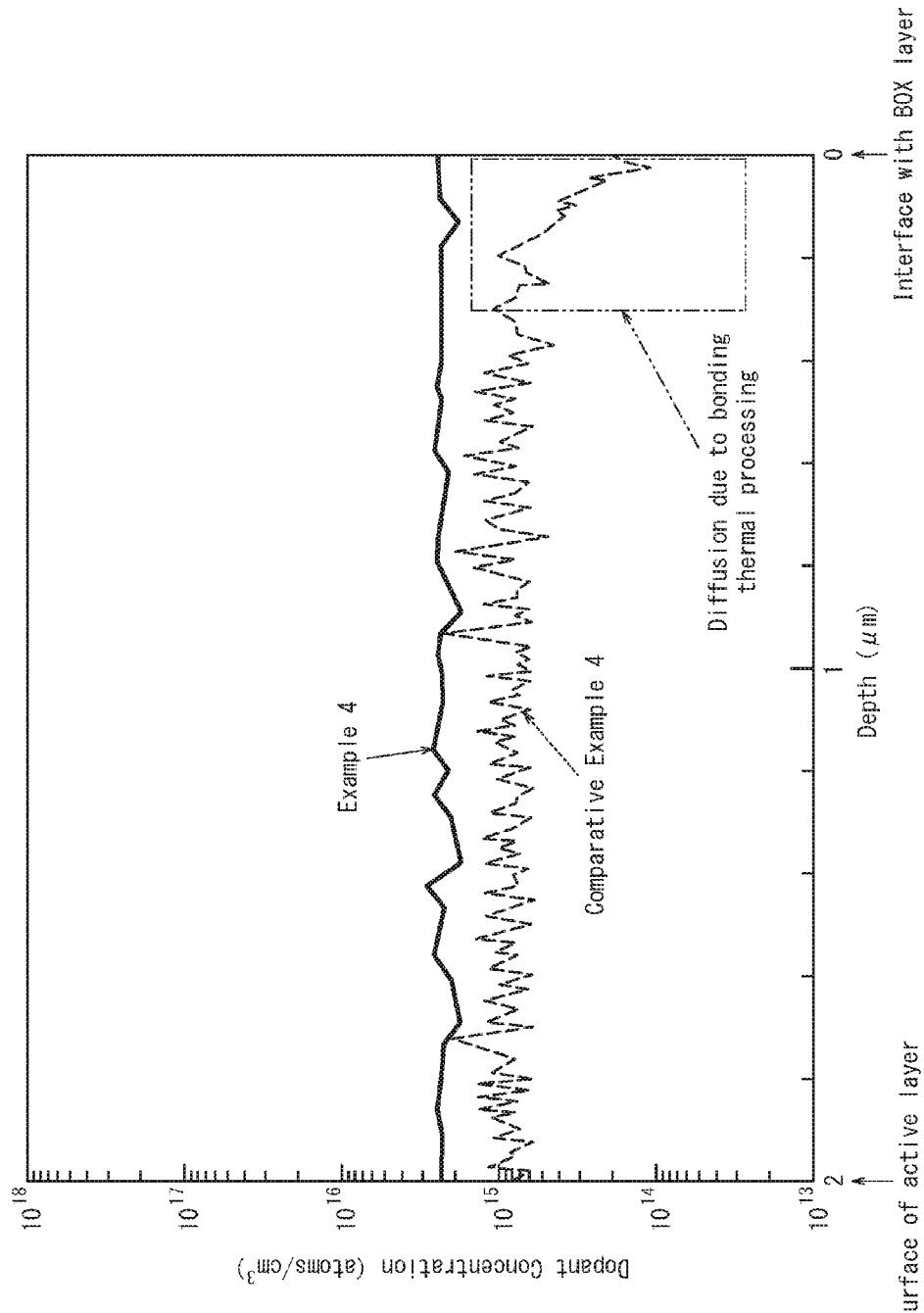
FIG. 13B is graph illustrating dopant concentration profiles in active layers in Comparative Example 4 and Example 4.

For each of Comparative Examples and Examples, a dopant (phosphor) concentration profile in the thickness direction of the active layer of the SOI wafer was measured according to SIMS. As representative examples, the concentration profiles of Comparative Example 2 and Example 2 are illustrated in FIG. 11B, the concentration profiles of Comparative Example 3 and Example 3 are illustrated in FIG. 12A, and the concentration profiles of Comparative Example 4 and Example 4 are illustrated in FIG. 13B.

<Evaluation of Resistance Distribution (SR Method)>

Figure 10B:
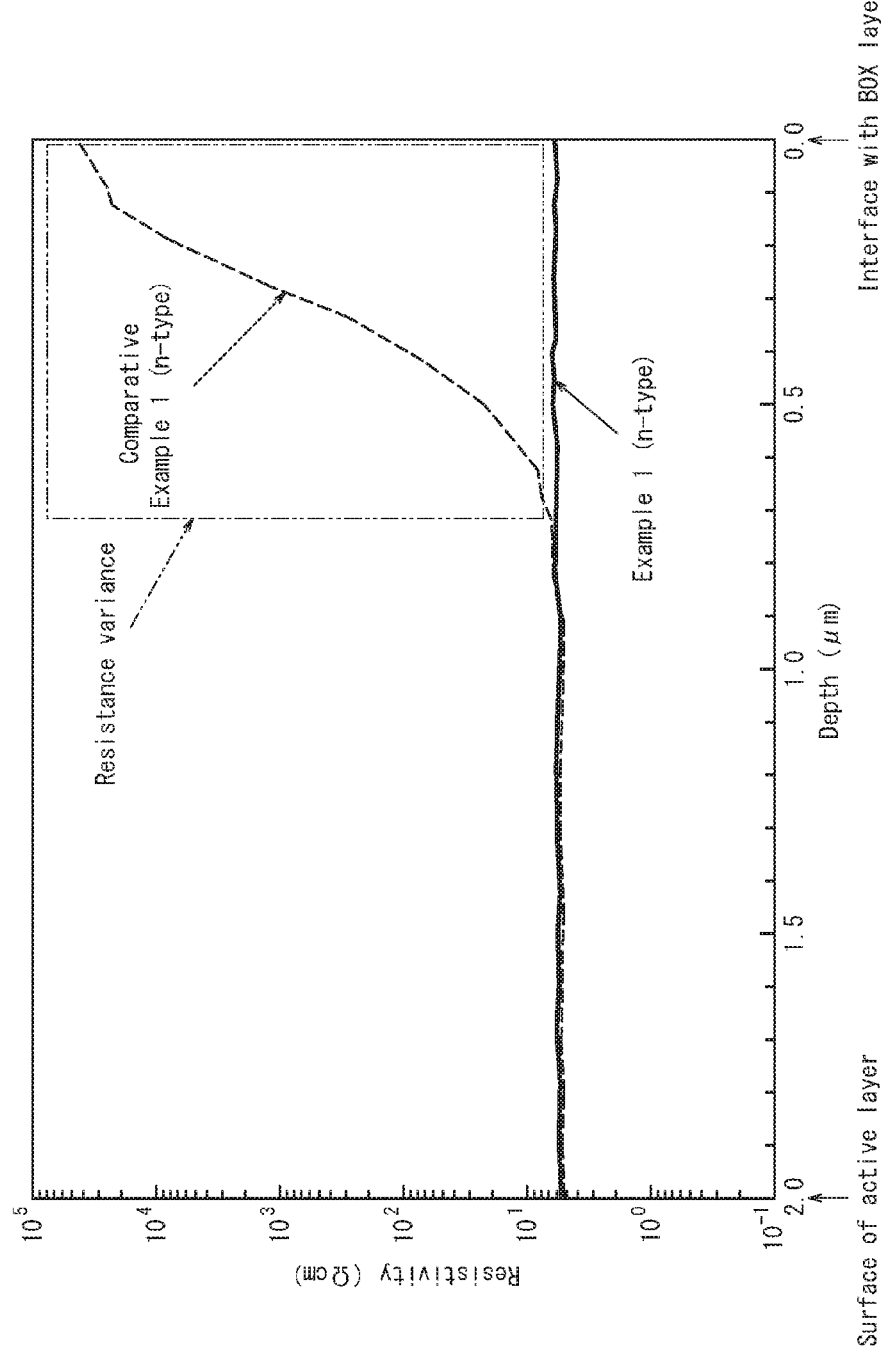
FIG. 10B is graph illustrating resistivity distributions in active layers after bonding in Comparative Example 1 and Example 1.
Figure 11C:
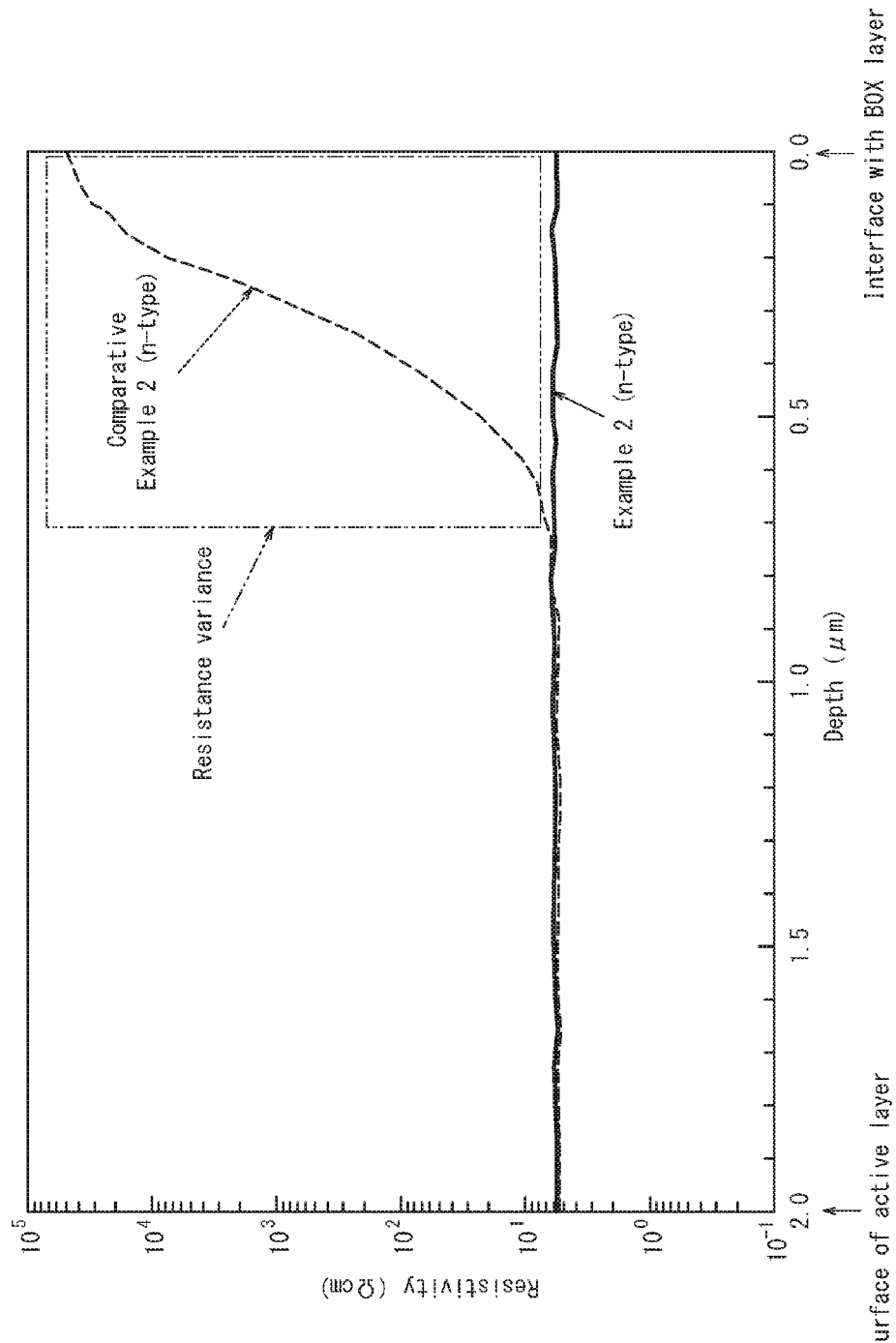
FIG. 11C is graph illustrating resistivity distributions in active layers after bonding in Comparative Example 2 and Example 2.
Figure 12B:
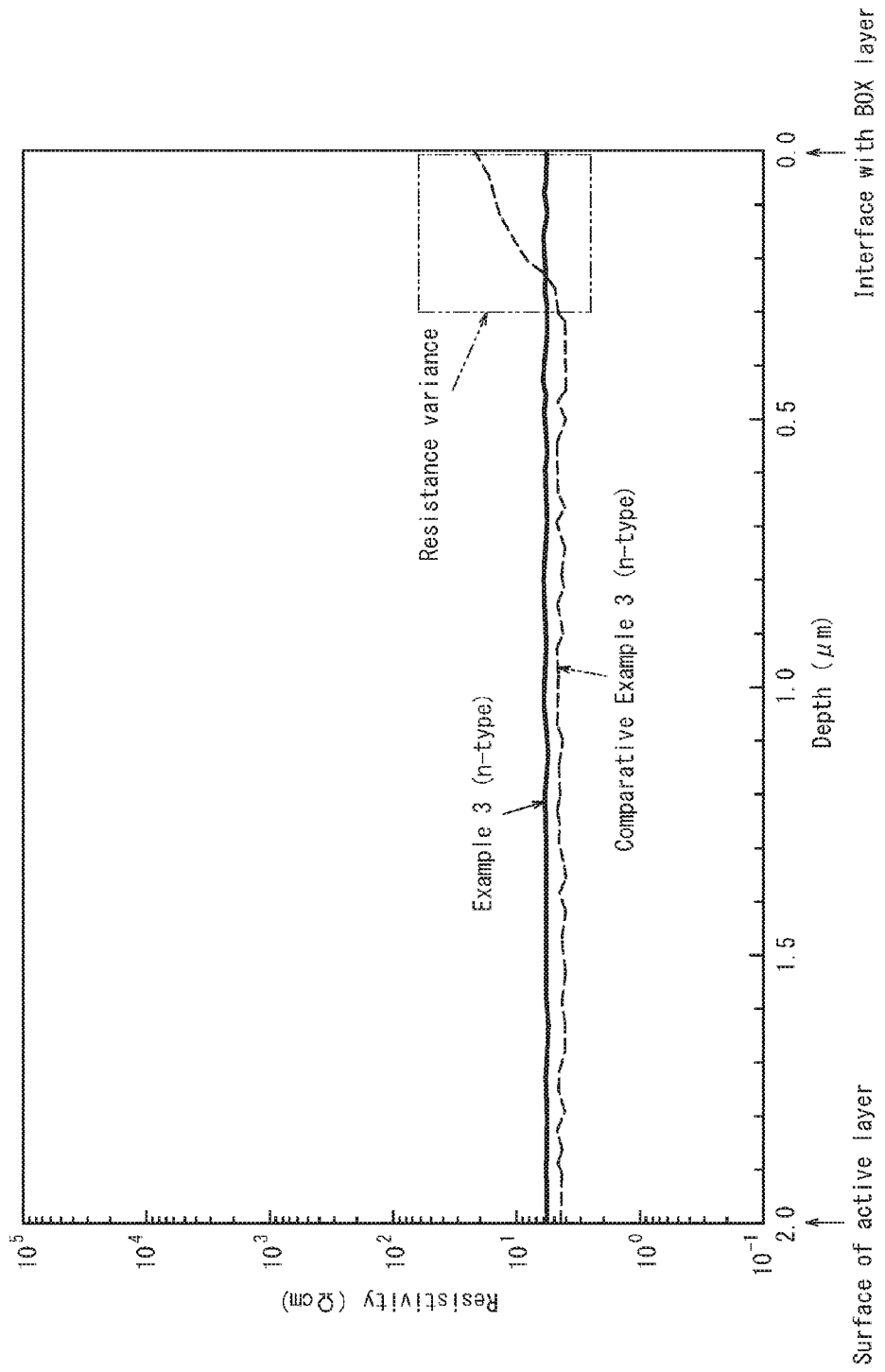
FIG. 12B is graph illustrating resistivity distributions in active layers after bonding in Comparative Example 3 and Example 3.
Figure 13C:
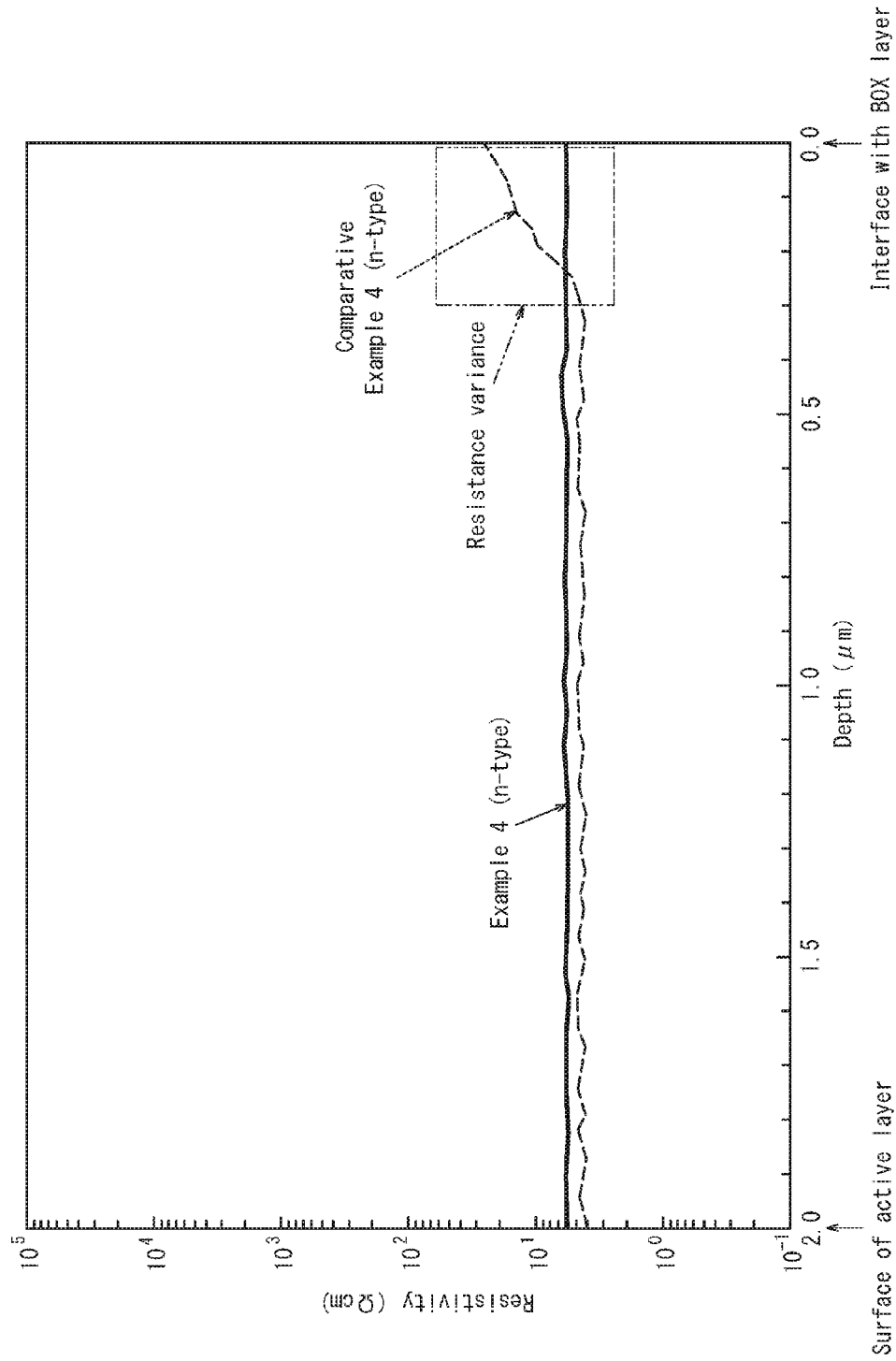
FIG. 13C is graph illustrating resistivity distributions in active layers after bonding in Comparative Example 4 and Example 4.

For each of Comparative Examples and Examples, resistivity in the active layer of the SOI wafer was measured by the spread resistance (SR) profiling method, and non-uniformity, that is, {(the maximum value−the minimum value)/ (the minimum value)×100}(%), in resistivity distribution in the thickness direction of the substrate to be used as the active layer was calculated. The result is shown in the column "resistance variation" in Table 1. Furthermore, as representative examples, the resistivity distributions of Comparative Example 1 and Example 1 are illustrated in FIG. 10B, the resistivity distributions of Comparative Example 2 and Example 2 are illustrated in FIG. 11C, the resistivity distributions of Comparative Example 3 and Example 3 are illustrated in FIG. 12B, and the resistivity distributions of Comparative Example 4 and Example 4 are illustrated in FIG. 13C.

(Description of Evaluation Result)

As illustrated in FIGS. 10A and 13A, in Comparative Example 1, the peak of the implanted element disappeared since the oxide film was formed according to the thermal oxidization method on the substrate in which a modified layer was formed by ion implantation, whereas in Example 1, the peak of the implanted element did not disappear since the oxide film was formed according to the ionization deposition method. Accordingly, although pits were observed on a surface of the active layer in Comparative Example 1, pits were not observed on a surface of the active layer in Example 1, which exhibited a high gettering ability.

Next, Comparative Example 2 is an SOI wafer manufactured according to the flow illustrated in FIG. 7. That is to say, light element ions were implanted to a surface of the substrate 10 to be used as the active layer to form the modified layer 12 in the substrate 10 to be used as the active layer, and the oxide film 18 was formed on surfaces of the support substrate 20 according to the thermal oxidization method, and subsequently, the substrate 10 to be used as the active layer and the support substrate 20 were bonded according to the bonding thermal processing, and then, the substrate 10 to be used as the active layer was thinned to obtain the active layer 22. In this case, as illustrated in FIG. 11A, the peak of the implanted element did not disappear, and pits were not observed on a surface of the active layer. However, as illustrated in FIG. 7, a layer 16 with variable resistance is formed in the vicinity of the support substrate with respect to the oxide film due to the thermal oxidization method, and after bonding, a layer 18 with variable resistance is also formed in the vicinity of the substrate to be used as the active layer with respect to the oxide film. Results that support the above fact are shown as resistance variations illustrated in FIGS. 11B and 11C and in Table 1. FIG. 11C indicates that resistivity varied significantly in the vicinity of the active layer with respect to the oxide film in Comparative Example 2. Although FIG. 11B indicates that a dopant diffused toward the oxide film as a result of the bonding thermal processing, the resistivity variance illustrated in FIG. 11C is far greater than the influence of the diffusion.

In Comparative Examples 3 and 4, although a significant resistance variance such as that in Comparative Example 2 was not observed since the oxide films were formed according to the ionization deposition method, resistance variances due to thermal diffusion of a dopant were observed since the bonding was performed according to the bonding thermal processing (Refer to resistance variations in FIGS. 12B and 13C and in Table 1).

On the other hand, in each of Examples 1 to 7, the peak of the implanted element did not disappear, pits were not observed on a surface of the active layer, a high gettering ability was exhibited, and a resistance variance in the thickness direction of the active layer was small.

<TZDB Measurement>

A time zero dielectric breakdown (TZDB) measurement was conducted on the SOI wafer according to Example 6 under a judgement current of $1\times10^{-4}$ $A/cm^2$. As details of a method of the measurement, the active layer formed above an oxide film was processed into an island shape with 1.8 mm sides by photolithography and etching processing, and, with the processed island serving as an electrode and with the support substrate side being set to zero (0) V, a voltage was applied to the electrode by increasing the voltage from 0 V by increments of 0.1 V step. A current value per unit area obtained by dividing a measured current value by an electrode area was defined as the judgment current. Furthermore, SOI wafers that are the same as Example 6 except for that the temperatures of the substrates during the formation of the oxide films were changed to 300° C., 400° C., 800° C., 900° C., and 1000° C. were prepared, and the pressure-resistant characteristics of the oxide films were evaluated similarly. Table 2 shows a result of the evaluation.

TABLE 2

| Temperature of Substrate (° C.) | TZDB measurement value (MV/cm$^2$) |
| --- | --- |
| 300 | 1.2 |
| 400 | 4.5 |
| 500 | 8.3 |
| 800 | 9.7 |
| 900 | 11.2 |
| 1000 | 15.1 |

INDUSTRIAL APPLICABILITY

The present disclosure provides an SOI wafer manufacturing process that allows production of an SOI wafer having a high gettering ability and a small resistance variance in the thickness direction of the active layer, at high productivity.

The invention claimed is:

1. An SOI wafer manufacturing process, comprising:
a first step of implanting light element ions to a surface of at least one of a first substrate made of silicon single crystal and a second substrate made of silicon single crystal to form, in the at least one of the first substrate and the second substrate, a modified layer in which the light element ions are present in solid solution;
a second step of forming an oxide film on a surface of at least one of the first substrate and the second substrate;
a third step of bonding the first substrate and the second substrate in a manner such that the modified layer and the oxide film are located between the first substrate and the second substrate; and
a fourth step, performed after the third step, of thinning the first substrate to obtain an active layer, wherein,
in the second step, the oxide film is deposited by accelerating and emitting ionized Si and oxygen to the at least one of the first substrate and the second substrate while heating the at least one of the first substrate and the second substrate, and
in the third step, the first substrate and the second substrate are bonded together at a normal temperature by emitting an ion beam or a neutral atomic beam to surfaces to be bonded of the first substrate and the second substrate under vacuum to activate the surfaces and subsequently by contacting the surfaces to be bonded with each other under vacuum.

2. The SOI wafer manufacturing process according to claim 1, wherein, in the second step, the at least one of the first substrate and the second substrate has a temperature of from 500° C. to 900° C.

3. The SOI wafer manufacturing process according to claim 1, wherein, in the first step, the modified layer is formed only in the second substrate.

4. The SOI wafer manufacturing process according to claim 1, wherein, in the second step, the oxide film is formed only on the second substrate.

5. The SOI wafer manufacturing process according to claim 1, wherein, in the second step, the oxide film is formed on both the first substrate and the second substrate.

6. The SOI wafer manufacturing process according to claim 1, wherein, the first substrate is an epitaxial silicon wafer including a bulk silicon substrate and a silicon epitaxial layer formed on a surface of the bulk silicon substrate, and, in the fourth step, the bulk silicon substrate is removed to obtain the active layer formed by the silicon epitaxial layer.

7. The SOI wafer manufacturing process according to claim 6, wherein a surface of the silicon epitaxial layer is mirror-polished before the third step.

8. The SOI wafer manufacturing process according to claim 6, wherein
the silicon epitaxial layer in the first substrate has a thickness that is determined in consideration of a desired thickness of the active layer and a thickness of an oxygen diffusion region formed by oxygen diffusion from the bulk silicon substrate into the silicon epitaxial layer, and,
in the fourth step, the oxygen diffusion region in the silicon epitaxial layer is also removed.

9. The SOI wafer manufacturing process according to claim 1, wherein the light element ions comprise at least one selected from H, He, C, Ar, and Si.

10. An SOI wafer comprising a support substrate made of silicon single crystal, an oxide film located above the support substrate, and an active layer located above the oxide film and made of silicon single crystal, the SOI wafer further comprising:
a modified layer in which a light element is present in solid solution, the modified layer being located in a vicinity of an interface of at least one of the active layer and the support substrate with respect to the oxide film, wherein
the active layer in a thickness direction thereof has a resistivity distribution in which {(maximum value−minimum value)/(minimum value)×100} is 20% or less.

11. The SOI wafer according to claim 10, wherein a result of TZDB measurement performed under a judgement current of 1×10$^{-4}$ A/cm$^2$ is 8 MV/cm$^2$ or more.

12. The SOI wafer according to claim 10, wherein the modified layer is located only in the vicinity of the interface of the support substrate with respect to the oxide film.

13. The SOI wafer according to claim 10, wherein the oxide film has a thickness of 10 μm or more.

14. The SOI wafer according to claim 10, wherein the active layer is composed of a silicon epitaxial layer.

15. The SOI wafer according to claim 10, wherein the light element comprises at least one selected from H, He, C, Ar, and Si.

* * * * *